United States Patent
Shiiyama et al.

(10) Patent No.: US 10,613,149 B2
(45) Date of Patent: Apr. 7, 2020

(54) MANAGING APPARATUS, COMPUTER-READABLE STORAGE MEDIUM, MANAGEMENT METHOD AND PRODUCTION METHOD

(71) Applicant: HONDA MOTOR CO., LTD., Tokyo (JP)

(72) Inventors: Takumi Shiiyama, Saitama (JP); Ryo Oshima, Saitama (JP); Ryuichi Kimata, Tokyo (JP)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 16/542,255

(22) Filed: Aug. 15, 2019

(65) Prior Publication Data

US 2019/0377029 A1    Dec. 12, 2019

Related U.S. Application Data

(63) Continuation of application No. PCT/JP2018/011555, filed on Mar. 22, 2018.

(30) Foreign Application Priority Data

Mar. 22, 2017  (JP) .................. 2017-056673

(51) Int. Cl.
  *G06F 11/30*    (2006.01)
  *G01R 31/367*   (2019.01)
  *G01R 31/392*   (2019.01)

(52) U.S. Cl.
  CPC ......... *G01R 31/367* (2019.01); *G01R 31/392* (2019.01)

(58) Field of Classification Search
  CPC .................................................. G01R 31/367
  See application file for complete search history.

(56) References Cited

U.S. PATENT DOCUMENTS 10,055,911 B2   8/2018   Luke
10,065,525 B2   9/2018   Chen
(Continued)

FOREIGN PATENT DOCUMENTS

JP   H10307952 A   11/1998
JP   2009021088 A   1/2009
(Continued)

OTHER PUBLICATIONS

International Search Report and (ISA/237) Written Opinion of the International Search Authority for International Patent Application No. PCT/JP2018/011555, issued/mailed by the Japan Patent Office dated Jun. 19, 2018.
(Continued)

*Primary Examiner* — Phuong Huynh

(57) ABSTRACT

A target information acquiring unit that acquires target information indicating a target condition about a degree of wear of an expendable; a usage information acquiring unit that acquires usage information indicating a degree of usage from a start of usage of the expendable; a wear information acquiring unit that acquires wear information indicating a degree of wear of the expendable; and a deciding unit that decides (i) whether or not usage of each expendable is possible and/or (ii) a degree of priority about usage of each expendable based on (i) a target condition indicated by the target information acquired by the target information acquiring unit, (ii) a degree of usage of each expendable indicated by the usage information acquired by the usage information acquiring unit and (iii) a degree of wear of each expendable indicated by the wear information acquired by the wear information acquiring unit are included.

16 Claims, 11 Drawing Sheets

(56) References Cited

U.S. PATENT DOCUMENTS

| | | | |
|---|---|---|---|
| 10,158,102 | B2 | 12/2018 | Wu |
| 10,186,094 | B2 | 1/2019 | Wu |
| 10,209,090 | B2 | 2/2019 | Luke |
| 10,345,843 | B2 | 7/2019 | Luke |
| 2013/0026971 | A1 | 1/2013 | Luke |
| 2013/0030580 | A1 | 1/2013 | Luke |
| 2013/0030581 | A1 | 1/2013 | Luke |
| 2013/0030608 | A1 | 1/2013 | Taylor |
| 2013/0030630 | A1* | 1/2013 | Luke ............ E05B 81/56 701/22 |
| 2013/0030920 | A1* | 1/2013 | Wu ............... B60L 1/003 705/14.64 |
| 2013/0033203 | A1 | 2/2013 | Luke |
| 2013/0116892 | A1 | 5/2013 | Wu |
| 2014/0142786 | A1 | 5/2014 | Huang |
| 2014/0251710 | A1 | 9/2014 | Juan |
| 2014/0253021 | A1 | 9/2014 | Luke |
| 2014/0266006 | A1 | 9/2014 | Luke |
| 2014/0277844 | A1 | 9/2014 | Luke |
| 2014/0279576 | A1 | 9/2014 | Luke |
| 2015/0042157 | A1 | 2/2015 | Chen |
| 2018/0043785 | A1 | 2/2018 | Takatsuka |
| 2018/0047031 | A1 | 2/2018 | Takatsuka |

FOREIGN PATENT DOCUMENTS

| | | |
|---|---|---|
| JP | 2014525229 A | 9/2014 |
| JP | 2014525230 A | 9/2014 |
| JP | 2014525231 A | 9/2014 |
| JP | 2014527390 A | 10/2014 |
| JP | 2014527689 A | 10/2014 |
| JP | 2014529117 A | 10/2014 |
| JP | 2014529118 A | 10/2014 |
| JP | 2014529119 A | 10/2014 |
| JP | 2014529392 A | 11/2014 |
| JP | 2014529982 A | 11/2014 |
| JP | 2014531699 A | 11/2014 |
| JP | 2014533480 A | 12/2014 |
| JP | 2015015827 A | 1/2015 |
| JP | 2015502881 A | 1/2015 |
| JP | 2015231837 A | 12/2015 |
| JP | 2015534927 A | 12/2015 |
| JP | 2016514357 A | 5/2016 |
| JP | 2016515063 A | 5/2016 |
| JP | 2016517257 A | 6/2016 |
| JP | 2016521389 A | 7/2016 |
| JP | 2016521393 A | 7/2016 |
| JP | 2016527871 A | 9/2016 |
| JP | 2016533154 A | 10/2016 |
| JP | 2016534518 A | 11/2016 |
| WO | 2016143373 A1 | 9/2016 |
| WO | 2016143374 A1 | 9/2016 |

OTHER PUBLICATIONS

Office Action issued for counterpart Japanese Application No. 2017-056673, drafted by the Japan Patent Office dated Feb. 21, 2018.

Decision to Grant a Patent issued for counterpart Japanese Application No. 2017-056673, drafted by the Japan Patent Office dated Apr. 26, 2018.

* cited by examiner

| 1000 | | | | LENDING STATUS 1030 | | RETURN STATUS 1040 | | | CHARGE/ DISCHARGE HISTORY AFTER BEING RETURNED 1050 |
|---|---|---|---|---|---|---|---|---|---|
| BATTERY ID 1010 | USER ID 1020 | DATE/TIME 1032 | SOC 1034 | STATION ID 1036 | DATE/TIME 1042 | SOC 1044 | STATION ID 1046 | | |
| B_0001 | U_0001 | / : | % | S_0002 | / : | % | S_0002 | ,,** |
| B_0001 | U_0002 | / : | % | S_0001 | / : | % | S_0001 | ,,** |
| ·· | ·· | ·· | ·· | ·· | ·· | ·· | ·· | ·· |
| B_0002 | U_0002 | / : | % | / : | / : | % | / : | ,,** |
| ·· | ·· | ·· | ·· | ·· | ·· | ·· | ·· | ·· |

| BATTERY ID 1110 | STATE OF HEALTH 1120 | CHARGE SPEED 1130 | CURRENT SOC 1140 | LENDING STATUS 1150 | OPERATIONAL STATUS 1160 | STORAGE LOCATION 1170 |
|---|---|---|---|---|---|---|
| B_0001 | % | HIGH SPEED | — | LENT | — | USER ID: |
| B_0002 | % | HIGH SPEED | 100% | RESERVED | WAITING | STATION ID: |
| B_0003 | % | INTERMEDIATE SPEED | 80% | CAN BE LENT | BEING CHARGED | STATION ID: |
| B_0004 | % | LOW SPEED | 30% | CANNOT BE LENT | WAITING | STATION ID: |
| : | : | : | : | : | : | : |

MANAGING APPARATUS, COMPUTER-READABLE STORAGE MEDIUM, MANAGEMENT METHOD AND PRODUCTION METHOD

This is a continuation application of International Application No. PCT/JP2018/011555 filed on Mar. 22, 2018, which claims priority to Japanese Patent Application No. 2017-056673 filed in JP on Mar. 22, 2017, the contents of each of which are incorporated herein by reference.

BACKGROUND

1. Technical Field

The present invention relates to a managing apparatus, a computer-readable storage medium, a management method and a production method.

2. Related Art

For example, a charging station that stores a storage battery for electric motorcycle and provides a user of an electric motorcycle with a charged storage battery is known (please refer to Patent Literature 1, for example).

PRIOR ART LITERATURE

Patent Literature

[Patent Literature 1] Japanese Translation of PCT International Patent Application No. 2016-521389

The summary clause does not necessarily describe all necessary features of the embodiments of the present invention. The present invention may also be a sub-combination of the features described above.

BRIEF DESCRIPTION OF THE DRAWINGS

FIG. 10 schematically shows an exemplary data table 1000.

FIG. 11 schematically shows an exemplary data table 1100.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention. The same or analogous portions in figures are given identical reference numbers, and the same explanations about them are omitted in some cases.

Summary of Managing Apparatus 100

Figure 1:
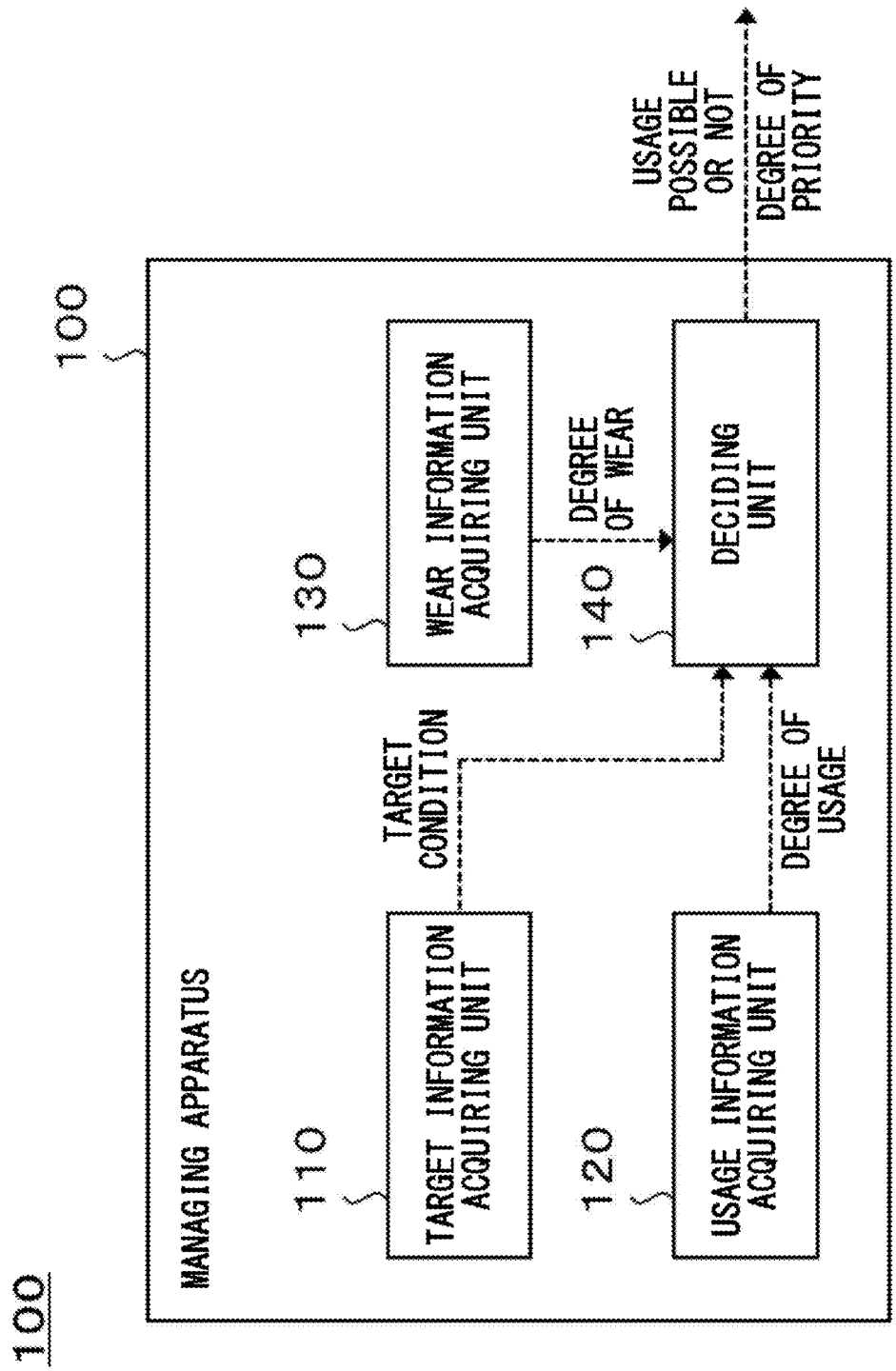
FIG. 1 schematically shows an exemplary system configuration of a managing apparatus 100.

FIG. 1 schematically shows an exemplary system configuration of a managing apparatus 100. In the present embodiment, the managing apparatus 100 for example manages usage of one or more expendables. An expendable for example has at least one of a quality, an amount, a value or a function that lowers according to the extent of usage (which may be referred to as the degree of usage) of the expendable. Depending on the type of an expendable, at least one of its quality, amount, value or function recovers by replenishing the expendable with a tangible matter or an intangible matter, regenerating at least part of the expendable, and so on. For example, if an expendable is a storage battery, the functions of the storage battery recovers by charging the storage battery. Examples of expendables may include storage batteries, connector terminals, and the like.

[Summary of Each Unit of Managing Apparatus 100]

In the present embodiment, the managing apparatus 100 for example includes a target information acquiring unit 110. The target information acquiring unit 110 for example acquires information (which may be referred to as target information) indicating various conditions (which may be referred to as target conditions) about the extent of wear of an expendable (which may be referred to as the degree of wear). The target information acquiring unit 110 may acquire target information for at least one expendable among a plurality of expendables. The target condition may include a condition about the degree of usage.

In the present embodiment, the managing apparatus 100 for example includes a usage information acquiring unit 120. The usage information acquiring unit 120 for example acquires information (which may be referred to as usage information) indicating the degree of usage of an expendable from the start of usage of the expendable. The usage information acquiring unit 120 may acquire usage information for each of at least one expendable. In the present embodiment, the managing apparatus 100 for example includes a wear information acquiring unit 130. The wear information acquiring unit 130 acquires information (which may be referred to as wear information) indicating the degree of wear of an expendable. The wear information acquiring unit 130 may acquire wear information for each of at least one expendable.

In the present embodiment, the managing apparatus 100 for example includes a deciding unit 140. The deciding unit 140 for example decides at least either (i) whether or not usage of an expendable is possible or (ii) the degree of priority about usage of the expendable. The deciding unit 140 may also decide at least either (i) whether or not usage of an expendable is possible or (ii) the degree of priority about usage of the expendable based on (i) a target condition indicated by target information acquired by the target information acquiring unit 110, (ii) the degree of usage of each expendable indicated by usage information acquired by the usage information acquiring unit 120, and (iii) the degree of wear of each expendable indicated by wear information acquired by the wear information acquiring unit 130. The deciding unit 140 may decide at least either (i) whether or not usage of each of at least one expendable is possible or (ii) the degree of priority about usage of the expendable.

Examples of whether or not usage of an expendable is possible may include (i) whether or not usage of the expendable is permitted, (ii) whether or not usage of the expendable is prohibited, (iii) whether or not the expendable is available, (iv) whether or not the expendable is unavailable, and so on. Examples of cases where usage of a particular expendable is prohibited or a particular expendable is unavailable may include cases where the particular expendable is a defective item, other expendables have higher priority for usage than that of the particular expendable, and so on.

Summary of Operation of Managing Apparatus 100

The managing apparatus 100 for example manages usage of a plurality of expendables by the following procedure. According to the present embodiment, first, the target information acquiring unit 110 acquires target information indicating a target condition about the degree of wear of at least one expendable among a plurality of expendables. Here, the target condition may include a condition about the degree of usage. The usage information acquiring unit 120 acquires usage information indicating the degree of usage of each of the at least one expendable from the start of usage of the expendable. In addition, the wear information acquiring unit 130 acquires wear information indicating the degree of wear of each of the at least one expendable.

Next, the deciding unit 140 acquires the target information from the target information acquiring unit 110. The deciding unit 140 may acquire the usage information from the usage information acquiring unit 120. The deciding unit 140 may also acquire the wear information from the wear information acquiring unit 130. Thereafter, for each of the at least one expendable, the deciding unit 140 decides at least either (i) whether or not usage of each expendable is possible or (ii) the degree of priority about usage of the expendable based on (i) the target condition indicated by the target information, (ii) the degree of usage of each expendable indicated by the usage information, and (iii) the degree of wear of each expendable indicated by the wear information.

According to the present embodiment, the managing apparatus 100 can manage the degrees of wear of a plurality of expendables. For example, the managing apparatus 100 manages a plurality of expendables, classifying them into a plurality of groups based on the period (which may be referred to as the introduction period) in which usage of each expendable is started. In this case, the managing apparatus 100 can manage the dispersion, variance or standard deviation of the degrees of wear of one or more expendables constituting each group. For example, the managing apparatus 100 can suppress increases, over time, in the dispersion, variance or standard deviation of the degrees of wear of one or more expendables constituting each group.

More specifically, the managing apparatus 100 extracts one or more expendables having higher priority for usage among a plurality of expendables based on at least either (i) whether or not usage of them are possible or (ii) their degrees of priority that are decided by the deciding unit 140. Then, the managing apparatus 100 manages usage of the plurality of expendables such that the extracted expendables are given higher priority for usage.

According to the present embodiment, for example, the dispersion, variance or standard deviation of the degrees of wear of a plurality of expendables that are introduced at a particular time or in a particular period can be suppressed. As a result, many of the plurality of expendables introduced at the particular time or in the particular period can be collected in the same period. In addition, it is possible to collect, in a predetermined first period, first parts of the plurality of expendables introduced at a particular time or in a particular period and collect, in a predetermined second period, second parts of the above-mentioned plurality of expendables.

Thereby, for example, the work efficiency of the work of collecting expendables with degraded performance improves. As expendables can be purchased together at once, the economic efficiency of the work of supplementation with new expendables improves. In addition, the proportion of expendables that are collected despite having sufficient performance can be lowered. Additionally, according to the present embodiment, for example, a plurality of expendable reused goods or second-hand goods can be produced. These reused goods or second-hand goods have comparatively uniform performance and provide high usage values.

Specific Configuration of Each Unit of Managing Apparatus 100

Each unit of the managing apparatus 100 may also be realized by hardware, software, or hardware and software. Each unit of the managing apparatus 100 may also be, at least partially, realized by a single server or a plurality of servers. Each unit of the managing apparatus 100 may also be, at least partially, realized on a virtual server or cloud system. Each unit of the managing apparatus 100 may also be, at least partially, realized by a personal computer or mobile terminal. Examples of the mobile terminal may include a mobile phone, a smartphone, a PDA, a tablet, a notebook computer or laptop computer, a wearable computer and the like. Each unit of the battery managing system 200 may also store information using a distributed ledger technology or distributed network such as a blockchain.

If at least some of components constituting the managing apparatus 100 are realized by software, the components realized by the software may be realized by activating, in a generally configured information processing apparatus, software or a program prescribing operations about the components. The above-mentioned generally configured information processing apparatus may include: (i) a data processing apparatus having processors such as a CPU or a GPU, a ROM, a RAM, a communication interface and the like, (ii) input apparatuses such as a keyboard, a pointing device, a touch panel, a camera, a sound input apparatus, a gesture input apparatus, various sensors or a GPS receiver, (iii) output apparatuses such as a display apparatus, a sound output apparatus or a vibration apparatus, and (iv) storage apparatuses (including external storage apparatuses) such as a memory, a HDD or an SSD.

In the above-mentioned generally configured information processing apparatus, the above-mentioned data processing apparatus or storage apparatuses may store the above-mentioned software or program. Upon being executed by a processor, the above-mentioned software or program causes the above-mentioned information processing apparatus to execute operations prescribed by the software or program. The above-mentioned software or program may also be stored in a non-transitory computer-readable recording medium. The above-mentioned software or program may be a program for causing a computer to function as the managing apparatus 100 or part of it. The above-mentioned software or program may be a program for causing a computer to execute information processing at the managing apparatus 100 or part of it.

Summary of Battery Managing System 200

Figure 2:
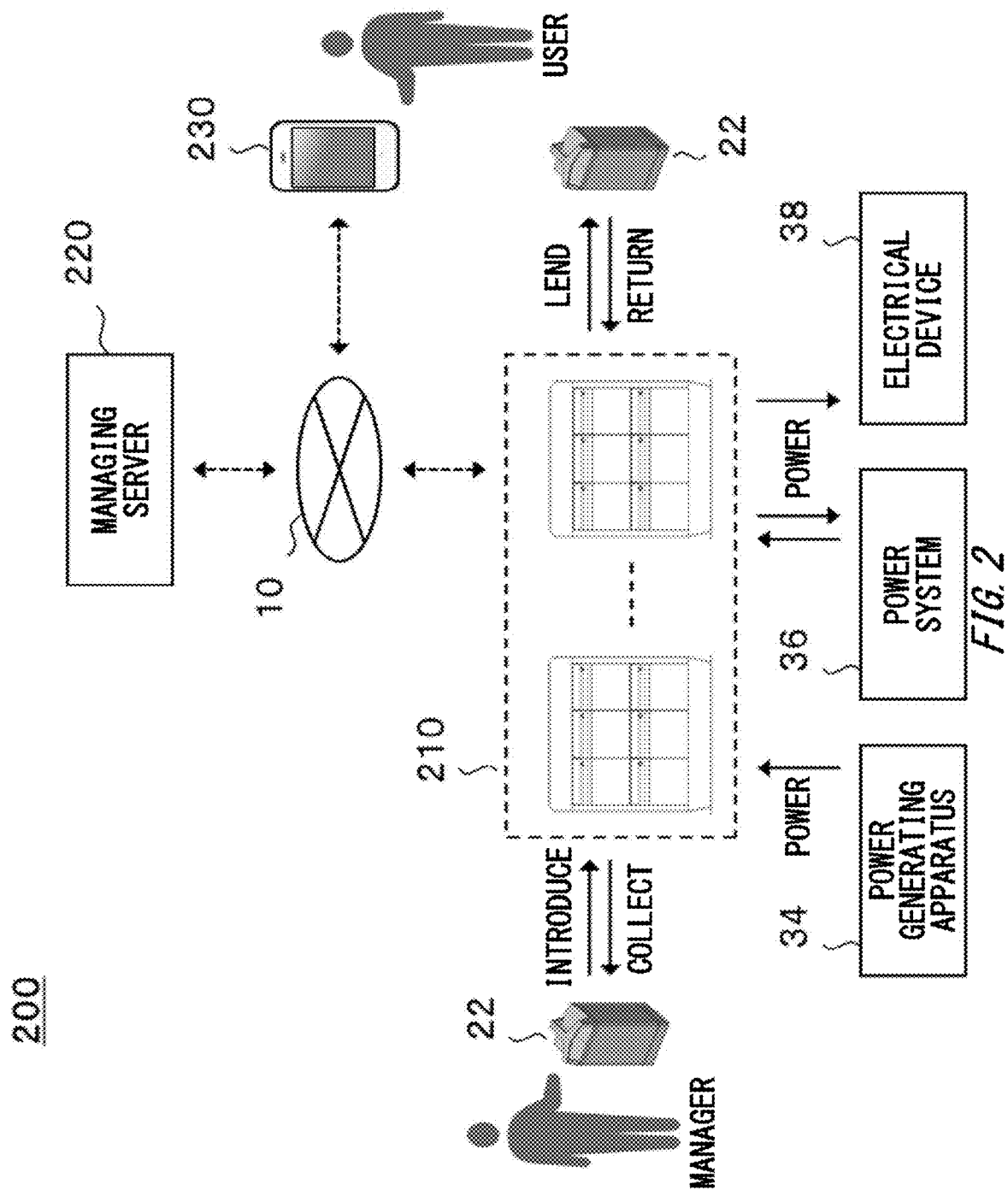
FIG. 2 schematically shows an exemplary system configuration of a battery managing system 200.

FIG. 2 schematically shows an exemplary system configuration of the battery managing system 200. In the present embodiment, the battery managing system 200 for example includes one or more battery stations 210 and a managing server 220. The battery managing system 200 may also include a user terminal 230. Individual units of the battery managing system 200 may transmit and receive information to and from each other through a communication network 10.

In the present embodiment, the communication network 10 may also be a wired communication transmission path, a wireless communication transmission path, or a combination of a wireless communication transmission path and a wired communication transmission path. The communication network 10 may also include a wireless packet communication network, the Internet, a P2P network, a private line, a VPN, an electric power line communication line and the like. The communication network 10: (i) may also include a mobile communication network such as a mobile phone line network; and (ii) may also include a wireless communication network such as a wireless MAN (for example, WiMAX (registered trademark)), a wireless LAN (for example, WiFi (registered trademark)), Bluetooth (registered trademark), Zigbee (registered trademark) or NFC (Near Field Communication).

In the present embodiment, details of the battery managing system 200 are explained taking as an example a case where the battery managing system 200 lends one or more mobile batteries 22 to users. The users use the lent mobile batteries 22 for example as power sources of electric motorcycles or electric bicycles. On the other hand, a manager of the one or more mobile batteries 22 collects mobile batteries 22 with degraded performance from the battery stations 210, and introduces new mobile batteries 22 to the battery stations 210.

In the present embodiment, the battery managing system 200 manages the one or more mobile batteries 22. The battery managing system 200 may manage usage of each of the one or more mobile batteries 22. For example, the battery managing system 200 manages the lending state, operational state (for example, being charged, being discharged and waiting), state of charge (for example, the current SOC), storage state (for example, a temperature or the like), state of health, or the like of each of the one or more mobile batteries 22. The form in which the one or more mobile batteries 22 are provided is not limited to lending. In addition, "one or more" may be written as "one or more" or "at least one".

The mobile batteries 22 may be used as power sources of mobile bodies, work machines or electrical devices. Each of the mobile bodies and work machines may be a mobile bodies and a work machine that use electric motors as sources of motive power. Examples of the mobile body may include automobiles, motorcycles, standing ride-type vehicles having motive power units, watercrafts, flight vehicles and the like. Examples of the automobiles may include gasoline cars, diesel cars, electric automobiles, fuel-cell automobiles, hybrid automobiles, small commuter automobiles, electric carts and the like. Examples of the motorcycles may include motorbikes, three-wheel motorbikes, electric bicycles and the like. Examples of the watercrafts may include ships, hovercrafts, water scooters, submarines, submersibles, underwater scooters and the like. Examples of the flight vehicles may include airplanes, airships or balloons, hot air balloons, helicopters, drones and the like. Examples of the work machines may include cultivators, snow remover, lawn mowers, bush cutters, grass mowers, high pressure washers, blowers, rammers, BIPSs (Battery Inverter Power Sources) and the like.

The mobile batteries 22 may be exemplary expendables or storage batteries (more specifically, potable storage batteries). The battery managing system 200 may be an exemplary managing apparatus. The battery stations 210 may be exemplary managing apparatuses. The battery stations 210 may be exemplary storage battery storing apparatuses that store one or more storage batteries. The managing server 220 may be an exemplary managing apparatus. The state of health may be an exemplary degree of deterioration.

Summary of Each Unit of Battery Managing System 200

In the present embodiment, a battery station 210 stores one or more mobile batteries 22. The battery station 210 may manage the one or more mobile batteries 22. For example, the battery managing system 200 manages usage of each of the one or more mobile batteries 22.

In the present embodiment, the battery station 210 lends the one or more mobile batteries 22 to users. The battery station 210 may lend a user a plurality of mobile batteries 22 as one set. Upon storage, in the battery station 210, of a mobile battery 22 having been used by a user up to then, the battery station 210 may lend the user a new mobile battery 22 stored in the battery station 210. Lending of the mobile batteries 22 may be exemplary usage of the mobile batteries 22.

In one embodiment, the battery station 210 charges the one or more mobile batteries 22. The battery station 210 may write information about the charge history of each mobile battery in a memory of each mobile battery. The information about the charge history may include at least one of charge start times, charge end times, conditions under which charging is performed (for example, conditions about at least either voltage or current), the SOC at the start of charging, the SOC at the end of charging, and identification information of the battery station 210 (which may be referred to as a station ID).

In another embodiment, the battery station 210 discharges the one or more mobile batteries 22. The battery station 210 may write information about the discharge history of each mobile battery in a memory of each mobile battery. The information about the discharge history may include at least one of discharge start times, discharge end times, conditions under which discharging is performed (for example, conditions about at least either voltage or current), the SOC at the start of discharging, the SOC at the end of discharging, and identification information of the battery station 210 (which may be referred to as a station ID).

The battery station 210 may also judge the state of health of each of the one or more mobile batteries 22. For example, the battery station 210 charges or discharges a mobile battery 22 to be a judgement target according to a predetermined charge/discharge pattern, and so on. The battery station 210 analyzes an obtained charge and discharge curve to judge the state of health of the mobile battery 22. The battery station 210 may write a result of judgement about the state of health of each mobile battery in a memory of each mobile battery.

In the present embodiment, the battery station 210 for example receives power from a power generating apparatus 34. The battery station 210 for example receives power from a power system 36. In addition, the battery station 210 for example supplies power to the power system 36. The battery station 210 for example supplies power to an electrical device 38.

In the present embodiment, the managing server 220 manages the one or more mobile batteries 22 (which may be referred to as to-be-managed mobile batteries). For example, the managing server 220 manages the specification, lending state, operational state, state of charge (for example, the current SOC), storage state (for example, a temperature or the like), state of health, error history, lending history or the like of a to-be-managed mobile battery. Examples of the operational state may include "being charged", "being discharged", "waiting" and the like.

In the present embodiment, the managing server 220 manages battery stations 210. The managing server 220 may also manage each of one or more battery stations 210 (which may be referred to as to-be-managed battery stations). For example, the managing server 220 manages the position, specification, operating state, operational state, chief manager (for example, an identification, name, title, address, telephone number or the like), error history, lending history or the like of a to-be-managed battery station.

Examples of the position of a battery station may include (i) the latitude and longitude, (ii) the latitude, longitude and altitude, (iii) the address or the like of the position where the battery station is located. Examples of the specification of a battery station may include the charge capacity of the battery station, the maximum number of mobile batteries 22 that the battery station can store (which may be referred to as the maximum number of stored items $N_{MAX}$) and the like.

Examples of the operating state may include "in operation", "suspended", "experiencing abnormality" and the like. Examples of the operational state may include (i) the lending status of a mobile battery 22, (ii) the rate of operation, (iii) the rank of priority for a to-be-lent mobile battery 22 and the like at a to-be-managed battery station. Examples of the lending status may include (i) the number of mobile batteries 22 being lent, (ii) the number of mobile batteries 22 being stored, (iii) the number of mobile batteries 22 that are available for lending, (iv) the proportion of the above-mentioned numbers (i) to (iii) to the maximum number of stored items, and the like. The rate of operation is for example determined as the proportion of the number $N_{RENT}$ of mobile batteries 22 that are available for lending to the maximum number of stored items $N_{MAX}$ ($N_{RENT}/N_{MAX}$).

In the present embodiment, the user terminal 230 is a communication terminal of a user who uses a mobile battery 22 or the battery managing system 200. The user terminal 230 for example accepts input from the user. The user terminal 230 may transmit various requests to the managing server 220 based on the input from the user. Examples of the various requests may include a search request for searching for a battery station 210 matching a particular condition, a reservation request for reserving any or a particular mobile battery 22 stored in a particular battery station 210, and the like.

In one embodiment, the user terminal 230 receives, from the managing server 220, information for generating a user interface screen (which may be referred to as a UI screen). The user terminal 230 may generate the UI screen based on the information that the user terminal 230 received from the managing server 220. The user terminal 230 may present the generated UI screen to the user. The UI screen may be exemplary information output by the user terminal 230. In another embodiment, the user terminal 230 may output a sound based on the information that the user terminal 230 received from the managing server 220.

The user terminal 230 may be any device as long as it can transmit and receive information to and from individual units (for example, the managing server 220) of the battery managing system 200 via the communication network 10, and details thereof are not particularly limited. Examples of the user terminal 230 may include a personal computer, a mobile terminal and the like. Examples of the mobile terminal may include a mobile phone, a smartphone, a PDA, a tablet, a notebook computer or laptop computer, a wearable computer and the like.

In the present embodiment explained, the managing server 220 manages one or more mobile batteries 22 and one or more battery stations 210. However, the battery managing system 200 is not limited to the present embodiment. In another embodiment, at least one of the one or more battery stations 210 may have the functions of the managing server 220, and the at least one battery station 210 may manage at least either the one or more mobile batteries 22 or the one or more battery stations 210. In this case, the battery managing system 200 may not include the managing server 220.

Specific Configuration of Each Unit of Battery Managing System 200

Each unit of the battery managing system 200 may also be realized by hardware, software, or hardware and software. Each unit of the battery managing system 200 may also be, at least partially, realized by a single server or a plurality of servers. Each unit of the battery managing system 200 may also be, at least partially, realized on a virtual server or cloud system. Each unit of the battery managing system 200 may also be, at least partially, realized by a personal computer or mobile terminal. Examples of the mobile terminal may include a mobile phone, a smartphone, a PDA, a tablet, a notebook computer or laptop computer, a wearable computer and the like. Each unit of the battery managing system 200 may also store information using a distributed ledger technology or distributed network such as a blockchain.

If at least some of components constituting the battery managing system 200 are realized by software, the components realized by the software may be realized by activating, in a generally configured information processing apparatus, software or a program prescribing operations about the components. The above-mentioned generally configured information processing apparatus may include: (i) a data processing apparatus having processors such as a CPU or a GPU, a ROM, a RAM, a communication interface and the like, (ii) input apparatuses such as a keyboard, a pointing device, a touch panel, a camera, a sound input apparatus, a gesture input apparatus, various sensors or a GPS receiver, (iii) output apparatuses such as a display apparatus, a sound output apparatus or a vibration apparatus, and (iv) storage apparatuses (including external storage apparatuses) such as a memory, a HDD or an SSD.

In the above-mentioned generally configured information processing apparatus, the above-mentioned data processing apparatus or storage apparatuses may store the above-mentioned software or program. Upon being executed by a processor, the above-mentioned software or program causes the above-mentioned information processing apparatus to execute operations prescribed by the software or program. The above-mentioned software or program may also be stored in a non-transitory computer-readable recording medium. The above-mentioned software or program may be a program for causing a computer to function as the battery managing system 200 or part of it. The above-mentioned software or program may be a program for causing a computer to execute information processing at the battery managing system 200 or part of it.

The above-mentioned software or program may be a program for causing a computer to execute a method of managing usage of a plurality of expendables. The above-mentioned program may be a program for causing a computer to execute a target information acquisition step of acquiring target information indicating a target condition about the degree of wear of at least one expendable among a plurality of expendables. The above-mentioned program may be a program for causing a computer to execute a usage information acquisition step of acquiring usage information indicating the degree of usage of each of at least one expendable from the start of usage of the expendable. The above-mentioned program may be a program for causing a computer to execute a wear information acquisition step of acquiring wear information indicating the degree of wear of each of at least one expendable. The above-mentioned program may be a program for causing a computer to execute, for each of the at least one expendable, a decision step of deciding at least either (i) whether or not usage of each expendable is possible or (ii) the degree of priority about usage of the expendable based on (i) the target condition indicated by the target information acquired at the target information acquisition step, (ii) the degree of usage of each expendable indicated by the usage information acquired at the usage information acquisition step and (iii) the degree of wear of each expendable indicated by the wear information acquired at the wear information acquisition step. In the above-mentioned program, the target condition may include a condition about the degree of usage.

The above-mentioned software or program may be a program for causing a computer to execute a method of producing one or more expendable reused goods or secondhand goods. The above-mentioned program may be a program for causing a computer to execute a target information acquisition step of acquiring target information indicating a target condition about the degree of wear of at least one expendable among the plurality of expendables. The above-mentioned program may be a program for causing a computer to execute a usage information acquisition step of acquiring usage information indicating the degree of usage of each of the at least one expendable from the start of usage of the expendable. The above-mentioned program may be a program for causing a computer to execute a wear information acquisition step of acquiring wear information indicating the degree of wear of each of the at least one expendable. The above-mentioned program may be a program for causing a computer to execute, for each of the at least one expendable, a decision step of deciding at least either (i) whether or not usage of each expendable is possible or (ii) the degree of priority about usage of the expendable based on (i) the target condition indicated by the target information acquired at the target information acquisition step, (ii) the degree of usage of each expendable indicated by the usage information acquired at the usage information acquisition step and (iii) the degree of wear of each expendable indicated by the wear information acquired at the wear information acquisition step. The above-mentioned program may be a program for causing a computer to execute an extraction step of extracting one or more expendables having higher priority for usage among the plurality of expendables based on at least either (i) whether or not usage of each expendable is possible or (ii) the degree of priority of the expendable that is decided in the decision step. In the above-mentioned program, the target condition may include a condition about the degree of usage.

Figure 3:
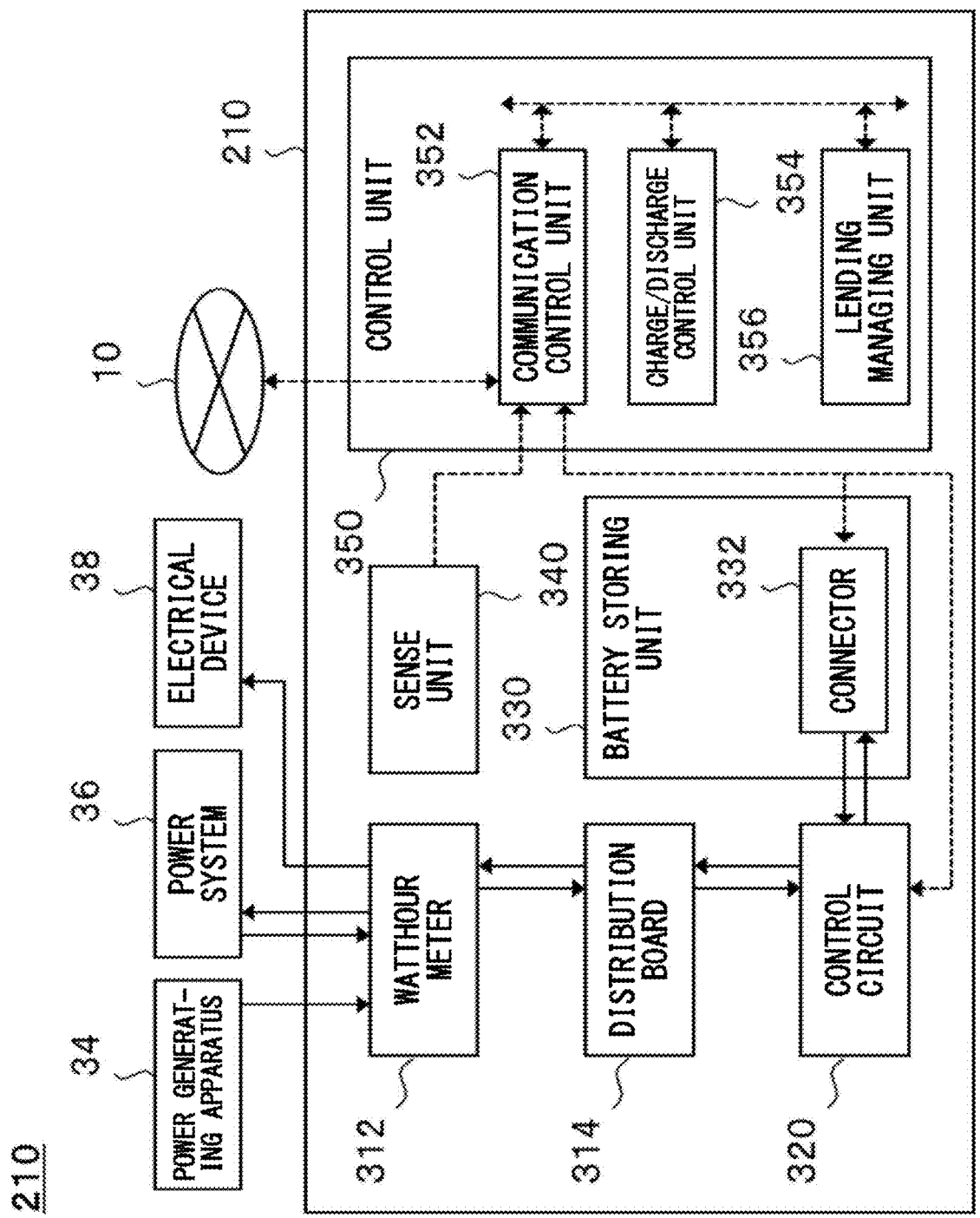
FIG. 3 schematically shows an exemplary internal configuration of a battery station 210.

FIG. 3 schematically shows an exemplary internal configuration of a battery station 210. In the present embodiment, the battery station 210 for example includes a watthour meter 312, a distribution board 314, a control circuit 320, a battery storing unit 330, a connector 332, a sense unit 340 and a control unit 350. In the present embodiment, the control unit 350 for example has a communication control unit 352, a charge/discharge control unit 354 and a lending managing unit 356. Individual units of the control unit 350 may transmit and receive information to and from each other.

The sense unit 340 may be an exemplary wear information acquiring unit and history information acquiring unit. The control unit 350 may be an exemplary managing apparatus. The communication control unit 352 may be an exemplary target information acquiring unit, usage information acquiring unit, wear information acquiring unit and history information acquiring unit. The lending managing unit 356 may be an exemplary managing apparatus.

In the present embodiment, the watthour meter 312 measures the amount of power that the battery station 210 received from at least either the power generating apparatus 34 or the power system 36 (which may be referred to as a power supplier). The watthour meter 312 may measure the power amount for each power supplier. In the present embodiment, the watthour meter 312 measures the amount of power that the battery station 210 supplied to at least either the power system 36 or the electrical device 38 (which may be referred to as a power consumer). The watthour meter 312 may measure the power amount for each power consumer.

In the present embodiment, the distribution board 314 receives power and distributes the power to individual units of the battery station 210. The distribution board 314 may be electrically connected to each of one or more connectors 332. The distribution board 314 may be electrically connected to each of one or more control circuits 320. The distribution board 314 may have a power conditioner. The power conditioner may have a bidirectional AC/DC circuit.

In the present embodiment, a control circuit 320 controls charging and discharging of a mobile battery 22. For example, the control circuit 320 receives, from the charge/discharge control unit 354, information or a signal for controlling charging and discharging. The control circuit 320 may control charging and discharging of a mobile battery 22 based on the information or signal from the charge/discharge control unit 354.

The control circuit 320 may include one or more unidirectional DC/DC circuits. Each of the one or more unidirectional DC/DC circuits may be electrically connected with the one or more connectors 332. The control circuit 320 may include one or more bidirectional DC/DC circuits. Each of the one or more bidirectional DC/DC circuits may be electrically connected with the one or more connectors 332. The control circuit 320 may include the same number of bidirectional DC/DC circuits as the maximum number of stored items of the battery station 210. The control circuit 320 may include a smaller number of bidirectional DC/DC circuits than the maximum number of stored items of the battery station 210.

In the present embodiment, the battery storing unit 330 stores at least one mobile battery 22. The battery station 210 may also include one or more battery storing units 330. Each of the one or more battery storing units 330 may also store a single mobile battery 22 or may also store a plurality of mobile batteries 22.

In the present embodiment, a connector 332 is electrically connected with each of one or more mobile batteries 22. The battery station 210 may also include one or more connectors 332. Each of the one or more connectors 332 may also be electrically connected with a single mobile battery 22 or may also be electrically connected with a plurality of mobile batteries 22. The modes of connection of connectors 332 and mobile batteries 22 may also be wired modes or wireless modes. A connector 332 for example transfers power between a mobile battery 22 and a control circuit 320. A connector 332 may also transfer communication signals between a mobile battery 22 and the communication control unit 352. A connector 332 for example is disposed inside the battery storing unit 330.

In the present embodiment, the sense unit 340 measures various physical quantities about at least either a mobile battery 22 or a battery station 210. Thereby, the sense unit 340 may also acquire information about at least one of one or more mobile batteries 22 or may also acquire information about each of one or more mobile batteries 22. The sense unit 340 may transmit the acquired information to the control unit 350. The sense unit 340 may have one or more types of sensor. For example, the sense unit 340 has one or more thermometers to measure temperature of at least one of the one or more mobile batteries 22. The measurement method of a thermometer may also be a contact method or a contactless method. The sense unit 340 may also be an overcurrent/overvoltage detector to detect at least either overvoltage or overcurrent of at least one of one or more mobile batteries 22.

In the present embodiment, the control unit 350 controls operation of a battery station 210. The control unit 350 executes various types of information processing methods at a battery station 210. The control unit 350 may receive information or a request from at least either the managing server 220 or the user terminal 230. The control unit 350 may transmit information or a request to at least either the managing server 220 or the user terminal 230. The control unit 350 may read in information recorded in a memory of a mobile battery 22. The control unit 350 may write in information in a memory of a mobile battery 22.

In a memory of a mobile battery 22, for example, identification information of a user (which may be referred to as a user ID), identification information of the mobile battery 22 (which may be referred to as a battery ID), information indicating the moving history or moving distance of the user or mobile battery 22, information indicating the state of health of the mobile battery 22, information indicating restrictions about charging of the mobile battery 22 (which may be referred to as a charge condition), or the like is stored. Examples of the identification information of a user may include (i) an ID that a manager of the battery managing system 200 assigned to each user, (ii) the name, title, common name or nickname of a user, (iii) an address, phone number, accounts of various services (for example, SNS accounts) of a user, (iv) an ID of a device using the mobile battery 22 (for example, an electric motorcycle or an electric bicycle), and the like.

In a memory of a mobile battery 22, information indicating the introduction period of the mobile battery 22 may also be stored. In a memory of a mobile battery 22, information indicating the history of charging and discharging of the mobile battery 22 may also be stored. The information indicating the history of charging and discharging may include at least either information indicating the history of charging or information indicating the history of discharging. The history of charging and discharging may be an exemplary usage history of a mobile battery 22 from the start of usage of the mobile battery 22.

In the present embodiment, the communication control unit 352 controls communication. In one embodiment, the communication control unit 352 controls communication between the control unit 350 and individual units of battery stations 210. In another embodiment, the communication control unit 352 controls communication between the control unit 350 and a device outside the battery stations 210. For example, the communication control unit 352 controls communication between the control unit 350 and at least either the managing server 220 or the user terminal 230. For example, the communication control unit 352 controls communication between the control unit 350 and a mobile battery 22. The communication control unit 352 may also be a communication interface. The communication control unit 352 may support one or more types of communication method.

In the present embodiment, the charge/discharge control unit 354 controls charging and discharging of one or more mobile batteries 22. The charge/discharge control unit 354 for example controls the control circuit 320 to thereby control charging and discharging of the mobile batteries 22. The charge/discharge control unit 354 for example controls timing of the start of charging or discharging of each of the one or more mobile batteries 22, timing of the end of the charging or discharging, the charge speed or discharge speed, or the like.

The charge/discharge control unit 354 may prepare the schedule of charging and discharging. For example, the charge/discharge control unit 354 decides which mobile battery 22 among one or more mobile batteries 22 stored in a battery station 210 is to be charged. The charge/discharge control unit 354 may also decide which mobile battery 22 among one or more mobile batteries 22 stored in a battery station 210 is to be charged until when and to what extent.

In the present embodiment, the lending managing unit 356 manages lending of a mobile battery 22 at a battery station 210. The lending managing unit 356 may also manage the state of one or more mobile batteries 22 stored in a battery station 210. For example, the lending managing unit 356 manages at least one of the operational state, state of charge, storage state and state of health of the above-mentioned mobile batteries 22. The lending managing unit 356 may manage the state of one or more mobile batteries 22 based on information acquired by the sense unit 340. The lending managing unit 356 may also detect an abnormality or defect of a mobile battery 22.

In the present embodiment explained, the control unit 350 is disposed at a battery station 210. However, the control unit 350 is not limited to the present embodiment. In another embodiment, the functions of the control unit 350 or some functions of the control unit 350 are realized by the managing server 220. For example, at least either the charge/discharge control unit 354 or the lending managing unit 356 is disposed at the managing server 220. The charge/discharge control unit 354 may also partially be disposed at the managing server 220. The lending managing unit 356 may also partially be disposed at the managing server 220.

Figure 4:
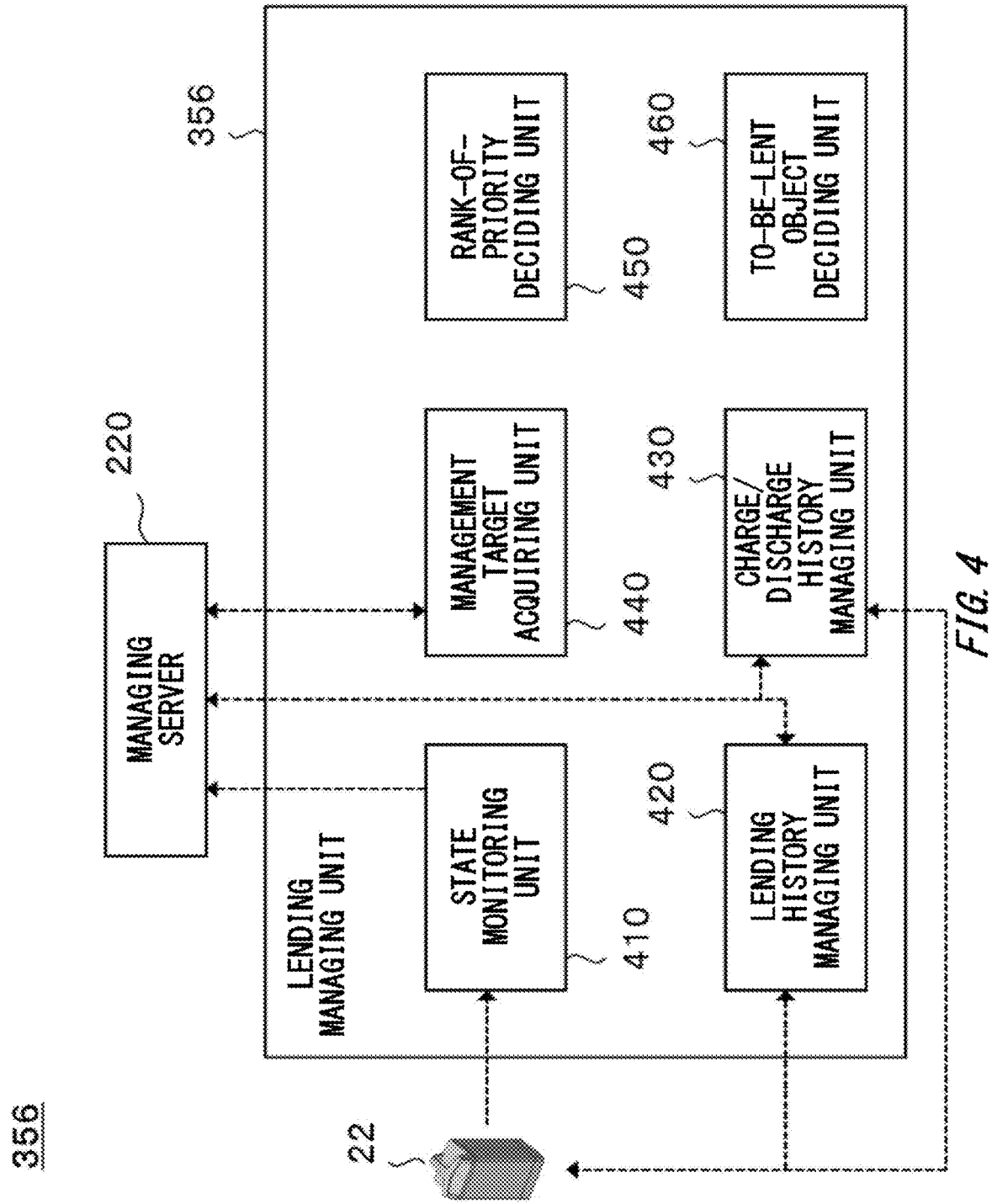
FIG. 4 schematically shows an exemplary internal configuration of a lending managing unit 356.

FIG. 4 schematically shows an exemplary internal configuration of the lending managing unit 356. In the present embodiment, the lending managing unit 356 for example includes a state monitoring unit 410, a lending history managing unit 420, a charge/discharge history managing unit 430, a management target acquiring unit 440, a rank-of-priority deciding unit 450 and a to-be-lent object deciding unit 460. Individual units of the lending managing unit 356 may transmit and receive information to and from each other. The lending managing unit 356 may also partially be disposed at the managing server 220. For example, at least either the rank-of-priority deciding unit 450 or the to-be-lent object deciding unit 460 may also be disposed at the managing server 220.

The state monitoring unit 410 may be an exemplary wear information acquiring unit. The lending history managing unit 420 may be an exemplary usage information acquiring unit and history information acquiring unit. The charge/discharge history managing unit 430 may be an exemplary usage information acquiring unit and history information acquiring unit. The management target acquiring unit 440 may be an exemplary target information acquiring unit. The rank-of-priority deciding unit 450 may be an exemplary target information acquiring unit. The to-be-lent object deciding unit 460 may be an exemplary extracting unit.

In the present embodiment, the state monitoring unit 410 monitors the state of a mobile battery 22 stored in a battery station 210. For example, the state monitoring unit 410 acquires various types of information about each of one or more mobile batteries 22 stored in a battery station 210. The state monitoring unit 410 may acquire information about at least one of the operational state, state of charge, storage state and state of health of the above-mentioned mobile batteries 22. The state monitoring unit 410 may transmit, to the managing server 220, information acquired by the state monitoring unit 410.

In one embodiment, the state monitoring unit 410 accesses a memory of each of the one or more mobile batteries 22 and acquires various types of information about the mobile battery stored in the memory. For example, the state monitoring unit 410 acquires information about deterioration of each mobile battery from a memory of the mobile battery. In another embodiment, the state monitoring unit 410 judges the state of health of at least one of the one or more mobile batteries 22 stored in the battery station 210. For example, the state monitoring unit 410 charges or discharges a mobile battery 22 to be a judgement target according to a predetermined charge/discharge pattern, and so on. The state monitoring unit 410 analyzes an obtained charge and discharge curve to judge the state of health of the above-mentioned mobile battery 22. The state monitoring unit 410 may write in information indicating the state of health of the above-mentioned mobile battery 22 in a memory of the above-mentioned mobile battery 22.

In still another embodiment, the state monitoring unit 410 acquires, from the sense unit 340, various types of information about each of one or more mobile batteries 22. For example, the state monitoring unit 410 may also acquire, from the sense unit 340, information indicating the state of charge of each of one or more mobile batteries 22. The information indicating the state of charge may be information indicating the SOC or information for calculating the SOC. Examples of the information for calculating the SOC may include information indicating voltage, information indicating cumulative values of charge current, and the like. The state monitoring unit 410 may acquire, from the sense unit 340, information indicating various measurement results about each of one or more mobile batteries 22 at the current time or latest measurement time. The state monitoring unit 410 may also acquire, from the sense unit 340, information in which various measurement results about each of one or more mobile batteries 22 and measurement times at which the measurement results are acquired are associated with each other. The state monitoring unit 410 may write in information that the state monitoring unit 410 acquired from the sense unit 340 in a memory of a corresponding mobile battery 22.

In the present embodiment, the lending history managing unit 420 manages the lending history of each of one or more mobile batteries 22 stored in a battery station 210. The lending history may be exemplary usage information indicating the degree of usage of a mobile battery 22 from the start of usage of the mobile battery 22. The lending history may also be exemplary history information indicating the usage history of a mobile battery 22 from the start of usage of the mobile battery 22.

In one embodiment, if a mobile battery 22 stored in a battery station 210 is lent to a user, the lending history managing unit 420 stores the battery ID of the lent mobile battery 22, the user ID of the user, the lending date/time, and the SOC at the time of the lending, in association with each other. The lending history managing unit 420 may also further store the station ID of the battery station 210 in association with the above-mentioned information. In another embodiment, if a mobile battery 22 is returned to a battery station 210, the lending history managing unit 420 stores the battery ID of the returned mobile battery 22, the return date/time, and the SOC at the time of the returning, in association with each other. The lending history managing unit 420 may also further store the station ID of the battery station 210 in association with the above-mentioned information.

When a mobile battery 22 is being lent, the lending history managing unit 420 may write in the lending history or part of the lending history in a memory of the mobile battery 22. When a mobile battery 22 is returned, the lending history managing unit 420 may access a memory of the returned mobile battery 22 and judges whether or not information indicating (i) the introduction period or (ii) the station ID of a battery station 210 where it was previously stored is recorded. If in the above-mentioned memory, information indicating (i) the introduction period and (ii) the station ID of the battery station 210 where it was previously stored is not recorded, the lending history managing unit 420 may store the present return date/time as the introduction period of the presently returned mobile battery 22.

The lending history managing unit 420 may analyze the lending history of a mobile battery 22 and calculate at least one of (i) the number of times of charging or discharging of the mobile battery 22 from the start of usage of the mobile battery 22 (which may be referred to as the number of times of charge/discharge), (ii) the utilization time during which the mobile battery 22 is lent to a user from the start of usage of the mobile battery 22 and (iii) the elapsed time from the introduction period of the mobile battery 22. The lending history managing unit 420 may also analyze the lending history of a mobile battery 22 and calculate an index determined based on at least one of the number of times of charge/discharge, the utilization time and the elapsed time. The number of times of charge/discharge of a mobile battery 22 may be an exemplary number of times of replenishment or regeneration of an expendable. The utilization time of a mobile battery 22 may be exemplary usage time of an expendable. The introduction period of a mobile battery 22 may be an exemplary time point at which usage of an expendable is started.

The lending history managing unit 420 may transmit information indicating the lending history to the managing server 220. The lending history managing unit 420 may transmit, to the managing server 220, information indicating the introduction period of a mobile battery 22. The lending history managing unit 420 may also transmit, to the managing server 220, information indicating a result of analysis about the lending history.

In the present embodiment, the charge/discharge history managing unit 430 manages the charge/discharge history of each of one or more mobile batteries 22 stored in a battery station 210. The charge/discharge history may be exemplary usage information indicating the degree of usage of a mobile battery 22 from the start of usage of the mobile battery 22. The lending history may also be exemplary history information indicating the usage history of a mobile battery 22 from the start of usage of the mobile battery 22. The charge/discharge history managing unit 430 may analyze the charge/discharge history of a mobile battery 22 and calculate the number of times of charge/discharge of the mobile battery 22 from the start of usage of the mobile battery 22.

The charge/discharge history managing unit 430 may transmit, to the managing server 220, at least either the charge/discharge history of a mobile battery 22 or a result of analysis about the charge/discharge history. The charge/discharge history managing unit 430 may also write in, in a memory of a mobile battery 22, at least either the charge/discharge history of the mobile battery 22 or a result of analysis about the charge/discharge history.

In the present embodiment, the management target acquiring unit 440 acquires information indicating a management target to be a criterion for managing one or more mobile batteries 22 stored in a battery station 210. For example, the management target acquiring unit 440 acquires, from the managing server 220, information indicating a management condition or a lending condition. The management target acquiring unit 440 may transmit, to the rank-of-priority deciding unit 450, the information indicating the management condition or the lending condition acquired by the management target acquiring unit 440.

In the present embodiment, the rank-of-priority deciding unit 450 decides the rank of priority for each of one or more mobile batteries 22 stored in a battery station 210 to be a to-be-lent object. For example, the rank-of-priority deciding unit 450 decides the rank of priority based on (i) the management condition or lending condition acquired by the management target acquiring unit 440 and (ii) at least either the lending history managed by the lending history managing unit 420 or the charge/discharge history managed by the charge/discharge history managing unit 430. The above-mentioned rank of priority may be information indicating (i) whether or not lending of a mobile battery 22 is possible and (ii) the degree of priority about lending of the mobile battery 22. Information indicating whether or not lending of a mobile battery 22 is possible may be exemplary information indicating whether or not usage of an expendable is possible. The degree of priority about lending of the mobile battery 22 may be an exemplary degree of priority of an expendable.

In one embodiment, the rank-of-priority deciding unit 450 decides the rank of priority based on the lending condition acquired by the management target acquiring unit 440. For example, for each of one or more mobile batteries 22 (which may be referred to as local mobile batteries 22) stored in a particular battery station 210, the rank-of-priority deciding unit 450 acquires, as a lending condition and from the managing server 220, information indicating the rank of priority (which may be referred to as the aggregate rank of priority) decided based on comparison with a plurality of mobile batteries 22 stored in one or more battery stations 210 (which may be referred to as aggregate mobile batteries 22). Based on the aggregate rank of priority received from the managing server 220, the rank-of-priority deciding unit 450 decides the rank of priority (which may be referred to as the local rank of priority) among the one or more mobile batteries 22 stored in the particular battery station 210.

In another embodiment, the rank-of-priority deciding unit 450 decides the rank of priority based on at least either the lending history managed by the lending history managing unit 420 or the charge/discharge history managed by the charge/discharge history managing unit 430. For example, the rank-of-priority deciding unit 450 decides the local rank of priority such that the rank of priority of a mobile battery 22 having a state matching a predetermined condition among the local mobile batteries 22 becomes higher than the ranks of priority of the other mobile batteries 22.

Examples of the predetermined condition may include: a condition that the SOC is out of a predetermined range; a condition that the length of time during which the SOC is out of a predetermined range meets a predetermined condition; a condition that the SOC is within a predetermined range; a condition that the length of time during which the SOC is within a predetermined range meets a predetermined condition; and the like. The above-mentioned predetermined ranges may also be predetermined specific numeric ranges, or may also be specific numeric ranges that are determined based on a predetermined algorithm. For example, specific numeric ranges of the above-mentioned ranges are calculated based on at least either time or an environmental temperature.

For example, if the value of the SOC remains higher than a first threshold for time longer than a second threshold, the progress of deterioration of a mobile battery 22 is promoted. In view of this, in such a case, the rank-of-priority deciding unit 450 makes the rank of priority of the mobile battery 22 higher than the ranks of priority of other mobile batteries 22.

In the present embodiment, the to-be-lent object deciding unit 460 decides next one or more to-be-lent mobile batteries 22 among local mobile batteries 22. For example, based on the ranks of priority decided by the rank-of-priority deciding unit 450, the to-be-lent object deciding unit 460 extracts next one or more to-be-lent mobile batteries 22 from the local mobile batteries 22. The next one or more to-be-lent mobile batteries 22 may be exemplary expendables having higher priority for usage.

Figure 5:
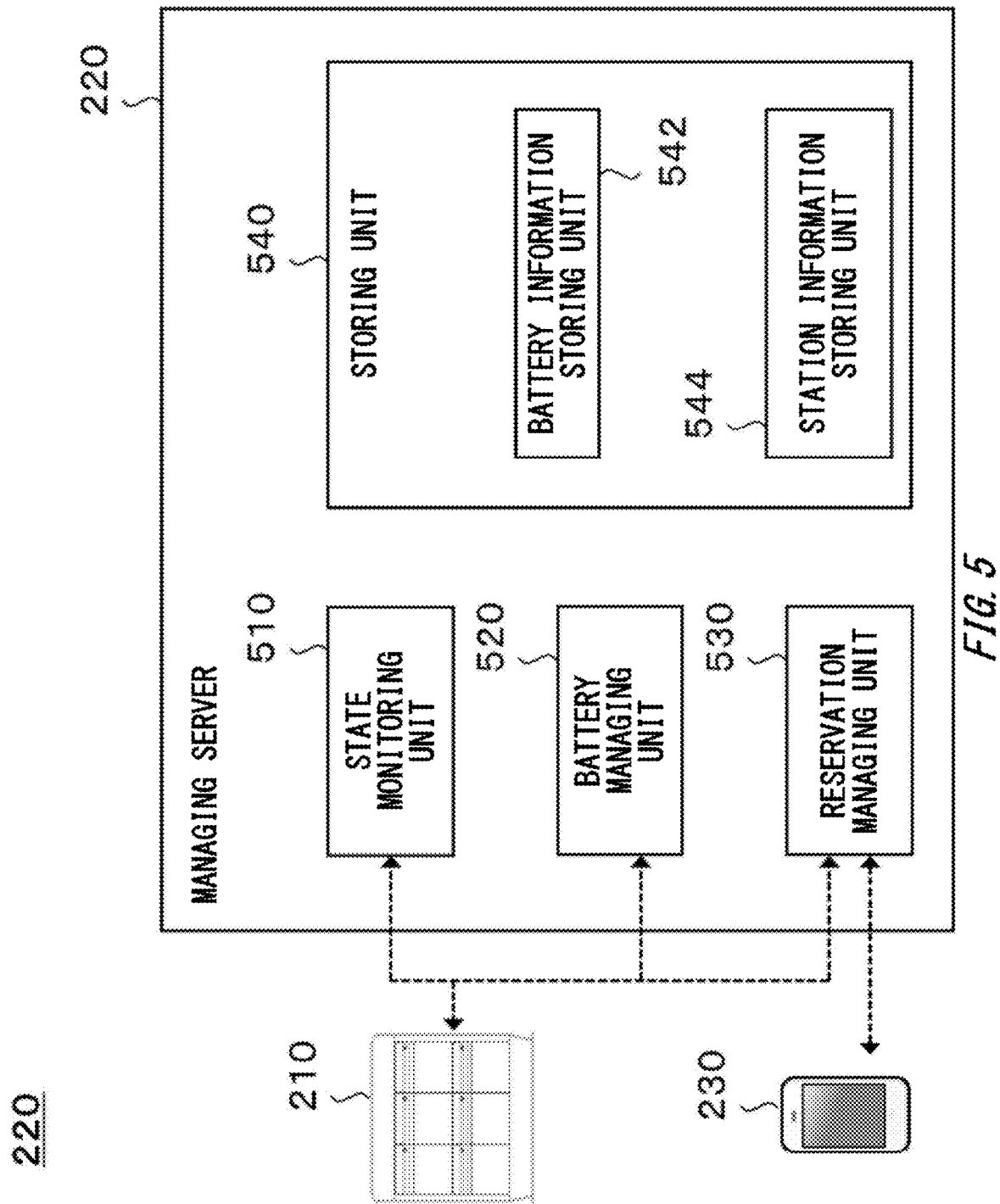
FIG. 5 schematically shows an exemplary system configuration of a managing server 220.

FIG. 5 schematically shows an exemplary system configuration of the managing server 220. In the present embodiment, the managing server 220 for example includes a state monitoring unit 510, a battery managing unit 520, a reservation managing unit 530 and a storing unit 540. In the present embodiment, the storing unit 540 for example has a battery information storing unit 542 and a station information storing unit 544. Individual units of the managing server 220 may transmit and receive information to and from each other. The state monitoring unit 510 may be an exemplary wear information acquiring unit. The battery managing unit 520 may be an exemplary managing apparatus.

In the present embodiment, the state monitoring unit 510 monitors each of to-be-managed battery stations 210. The state monitoring unit 510 acquires information about at least either the operating state or operational state of each of the to-be-managed battery stations 210 from the battery station 210. For example, the state monitoring unit 510 acquires information indicating the rate of operation of each of the to-be-managed battery stations 210 from the battery station 210. The state monitoring unit 510 may also acquire information indicating the presence or absence of an abnormality at each of the to-be-managed battery stations 210 from the battery station 210. The state monitoring unit 510 may also acquire information indicating suspension or planned suspension of each of the to-be-managed battery stations 210 from the battery station 210.

In the present embodiment, the state monitoring unit 510 monitors each of to-be-managed mobile batteries 22. For example, the state monitoring unit 510 may acquire, from each of the to-be-managed battery stations 210, information about at least one of the operational state, state of charge, storage state and state of health of a mobile battery 22 stored in the battery station 210.

In the present embodiment, the state monitoring unit 510 monitors the state of a user. For example, the state monitoring unit 510 acquires various types of information about a user from the user terminal 230. The state monitoring unit 510 may acquire, from the user terminal 230, positional information indicating the position of the user terminal 230. The state monitoring unit 510 may acquire, from the user terminal 230, information indicating the moving history of the user terminal 230. In this case, the moving history may be expressed by the position indicated by a GPS signal and a time at which the GPS signal is received. The state monitoring unit 510 may also acquire, from each of the to-be-managed battery stations 210, information about the moving history of a user having been stored in a memory of a to-be-managed mobile battery 22.

In the present embodiment, the reservation managing unit 530 manages the reservation status of a to-be-managed mobile battery 22. For example, the reservation managing unit 530 accepts a reservation request from the user terminal 230 and executes a reservation process. The reservation managing unit 530 stores a result (which may be referred to as reservation information) of execution of the reservation process. The reservation information for example includes information about a user ID, the date on which the lending is requested, the time at which the lending is requested, a station ID, a battery ID, a requested state of charge, a usage fee, a payment method and the like. The reservation information may also include information indicating the time (which may be referred to as the reservation time) at which the reservation request is accepted and information indicating the position of a user at the reservation time. The reservation managing unit 530 may manage the history of reservation information. The reservation managing unit 530 may also accept a search request from the user terminal 230 and execute a search process.

In the present embodiment, the storing unit 540 stores various types of information. The storing unit 540 may store information generated or acquired by the state monitoring unit 510, battery managing unit 520 and reservation managing unit 530. In the present embodiment, the battery information storing unit 542 stores various types of information about each of to-be-managed mobile batteries 22. The battery information storing unit 542 may also store information indicating the lending history a to-be-managed mobile battery 22. The battery information storing unit 542 may also store various types of information about a user of a mobile battery 22. In the present embodiment, the station information storing unit 544 stores various types of information about each of to-be-managed battery stations 210.

Figure 6:
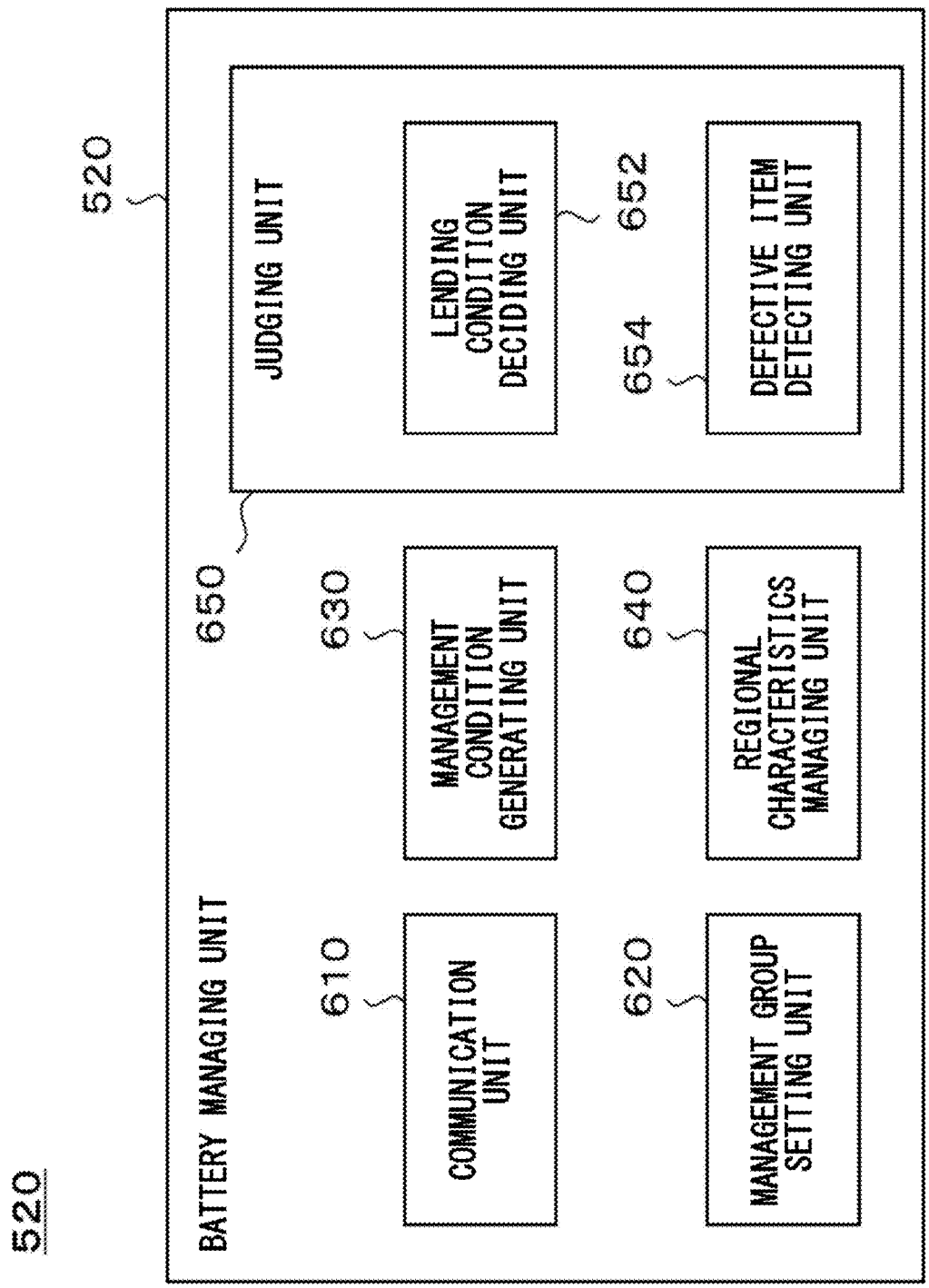
FIG. 6 schematically shows an exemplary internal configuration of a battery managing unit 520.

FIG. 6 schematically shows an exemplary internal configuration of the battery managing unit 520. In the present embodiment, the battery managing unit 520 for example includes a communication unit 610, a management group setting unit 620, a management condition generating unit 630, a regional characteristics managing unit 640 and a judging unit 650. In the present embodiment, the judging unit 650 has a lending condition deciding unit 652 and a defective item detecting unit 654.

The communication unit 610 may be an exemplary target information acquiring unit, usage information acquiring unit, wear information acquiring unit and history information acquiring unit. The management condition generating unit 630 may be an exemplary target condition generating unit. The judging unit 650 may be an exemplary managing apparatus and deciding unit. The lending condition deciding unit 652 may be an exemplary managing apparatus and deciding unit. The defective item detecting unit 654 may be an exemplary managing apparatus and deciding unit.

In the present embodiment, the communication unit 610 for example supports transmission and reception of information between the battery managing unit 520 and individual units of the managing server 220. The communication unit 610 may also support transmission and reception of information between the battery managing unit 520 and a device outside the managing server 220. For example, the communication unit 610 supports transmission and reception of information between the battery managing unit 520 and at least either a battery station 210 or the user terminal 230.

In the present embodiment, the management group setting unit 620 classifies aggregate mobile batteries 22 into one or more groups. For example, the management group setting unit 620 classifies aggregate mobile batteries 22 into one or more groups according to the extent of usage of each mobile battery from the start of usage of each mobile battery. The management group setting unit 620 may classify aggregate mobile batteries 22 into one or more groups based on at least either (i) at least one of the number of times of charge/discharge, utilization time and elapsed time of each mobile battery or (ii) an index determined based on at least one of the number of times of charge/discharge, utilization time and elapsed time of each mobile battery.

In the present embodiment, the management condition generating unit 630 generates a management condition to be a criterion to be used in managing a to-be-managed mobile battery 22. The management condition may include a condition about an index (which may be referred to as a usage index) indicating the extent of usage of a mobile battery 22 from the start of usage of the mobile battery 22. The usage index may be at least one of the number of times of charge/discharge, utilization time and elapsed time of a mobile battery 22. The usage index may also be an index determined based on at least one of the number of times of charge/discharge, utilization time and elapsed time of a mobile battery 22. The management condition for example represents a correspondence between the usage index of a mobile battery 22 and a value or range to be a management target of the state of health of the mobile battery 22. The management condition may be an exemplary target condition. The usage index may be an exemplary degree of usage. The state of health of a mobile battery 22 may be an exemplary degree of wear of an expendable.

In one embodiment, the management condition generating unit 630 generates a management condition based on an experimental result. The management condition generating unit 630 for example generates a management condition based on an experimental result obtained by the following procedure. First, charge and discharge of one or more mobile batteries are repeated according to a predetermined charge/discharge pattern. Next, upon completion of a predetermined number of times of charge/discharge, the state of health of each mobile battery is measured, and statistics of the state of health are calculated. The state of health for example may also be expressed by segments such as normal states, appropriately deteriorated states, deterioration progressing states or deterioration terminal states. Examples of the statistics may include means, trimmed means, medians, modes and the like. Thereby, a management condition indicating a correspondence between the number of times of charge/discharge of a mobile battery and the statistics of the state of health of the mobile battery is obtained.

Using a factor of conversion between the number of times of charge/discharge and utilization time, a management condition indicating a correspondence between the utilization time of a mobile battery and statistics of the state of health of the mobile battery is obtained from the management condition indicating the correspondence between the number of times of charge/discharge of the mobile battery and the statistics of the state of health of the mobile battery. Using a factor of conversion between the number of times of charge/discharge and elapsed time, a management condition indicating a correspondence between the elapsed time of a mobile battery and statistics of the state of health of the mobile battery is obtained from the management condition indicating the correspondence between the number of times of charge/discharge of the mobile battery and the statistics of the state of health of the mobile battery. Using a factor of conversion between the number of times of charge/discharge and an index determined based on at least one of the number of times of charge/discharge, utilization time and elapsed time of a mobile battery, a management condition indicating a correspondence between the above-mentioned index about the mobile battery and the statistics of the state of health of the mobile battery is obtained from the management condition indicating the correspondence between the number of times of charge/discharge of the mobile battery and the statistics of the state of health of the mobile battery.

In another embodiment, the management condition generating unit 630 generates a management condition using information that the managing server 220 acquired from one or more battery stations 210. For example, the management condition generating unit 630 analyzes information collected by the managing server 220, and calculates a correspondence between various usage indices about the aggregate mobile batteries 22 and statistics of the states of health of the aggregate mobile batteries 22 to thereby generate a management condition. The management condition generating unit 630 may also generate a management condition based on: a correspondence between various usage indices and statistics of states of health obtained based on an experimental result; and a correspondence between various usage indices and statistics of states of health obtained by analyzing information collected by the managing server 220.

In still another embodiment, the management condition generating unit 630 generates a management condition for each of one or more groups classified by the management group setting unit 620. The management condition generating unit 630 for example generates a management condition for each group by the following procedure. First, the management condition generating unit 630 for example accesses the battery managing unit 520, and for each of the one or more groups, acquires various types of information about each of one or more mobile batteries 22 constituting each group. Next, the management condition generating unit 630 analyzes information acquired from the battery managing unit 520, and for each group, calculate a correspondence between various usage indices and statistics of states of health. Thereby, a management condition for each group is obtained.

In the present embodiment, the regional characteristics managing unit 640 manages characteristics of each region. For example, the regional characteristics managing unit 640 calculates conversion factors of different usage indices for each region. For example, the regional characteristics managing unit 640 first analyzes the lending history of aggregate mobile batteries 22 or the lending history of some of the aggregate mobile batteries 22 and extracts the lending history in a particular region. Next, based on the extracted lending history, the regional characteristics managing unit 640 calculates at least one of (i) a factor of conversion between the number of times of charge/discharge and utilization time, (ii) a factor of conversion between the number of times of charge/discharge and elapsed time, and (iii) a factor of conversion between the number of times of charge/discharge and an index determined based on at least one of the number of times of charge/discharge, utilization time and elapsed time of a mobile battery. A conversion factor for each region calculated by the regional characteristics managing unit 640 is used for example when the management condition generating unit 630 generates a management condition.

In the present embodiment, the judging unit 650 implements a variety of judgement about mobile batteries 22. In one embodiment, for at least one of aggregate mobile batteries 22, the judging unit 650 judges the aggregate rank of priority of the mobile battery. In another embodiment, for at least one of aggregate mobile batteries 22, the judging unit 650 judges whether or not the mobile battery is a defective item. The at least one mobile battery 22 may also be one or more mobile batteries 22 classified into the same group by the management group setting unit 620.

In the present embodiment, for at least one of aggregate mobile batteries 22, the lending condition deciding unit 652 decides a lending condition of the mobile battery. For example, as a lending condition about at least one of aggregate mobile batteries 22, the lending condition deciding unit 652 decides the aggregate rank of priority of the mobile battery. The lending condition deciding unit 652 may also judge a mobile battery 22 having an aggregate rank of priority matching a predetermined condition as being unavailable. The lending condition deciding unit 652 for example judges a mobile battery 22 having an aggregate rank of priority lower than a predetermined threshold as being unavailable until the above-mentioned rank of priority becomes higher than the threshold.

The lending condition deciding unit 652 for example decides the aggregate rank of priority by the following procedure. For example, the lending condition deciding unit 652 first acquires a management condition about at least one mobile battery 22 from the management condition generating unit 630. The lending condition deciding unit 652 may acquire information about a current usage index of each of at least one mobile battery 22 from the communication unit 610. In addition, the lending condition deciding unit 652 may acquire information indicating the current state of health of each of at least one mobile battery 22 from the communication unit 610. The lending condition deciding unit 652 may also acquire at least either the lending history or charge/discharge history of each of at least one mobile battery 22 from the communication unit 610.

Next, for each of at least one mobile battery 22, the lending condition deciding unit 652 judges the aggregate rank of priority based on (i) a management condition indicating a correspondence between a usage index and a state of health, (ii) the current usage index and (iii) the current state of health. According to one embodiment, for each of at least one mobile battery 22, the lending condition deciding unit 652 first decides a value or range (which may be referred to as a management target) to be a target in management of the state of health, based on a current usage index and a management condition. Next, the lending condition deciding unit 652 decides the aggregate rank of priority such that the difference between the management target of the state of health and the current state of health decreases.

According to another embodiment, for each of at least one mobile battery 22, the lending condition deciding unit 652 first decides a management target of the state of health, based on a current usage index and a management condition. Next, the lending condition deciding unit 652 decides the aggregate rank of priority based on (i) the difference between the management target of the state of health and the current state of health and (ii) at least either the lending history or the charge/discharge history.

More specifically, for each of at least one mobile battery 22, the lending condition deciding unit 652 judges whether the progress of deterioration is faster or slower than the management target of the state of health by comparing the current state of health and the management target based on the difference between the management target of the state of health and the current state of health. In addition, for each of at least one mobile battery 22, the lending condition deciding unit 652 judges whether or not at least either the lending history or the charge/discharge history matches a predetermined condition. The lending condition deciding unit 652 decides the aggregate rank of priority based on (i) a result of judgement about whether the progress of deterioration is faster or slower than the management target and (ii) a result of judgement about whether or not at least either the lending history or the charge/discharge history matches a predetermined condition.

According to one embodiment, the lending condition deciding unit 652 decides the aggregate ranks of priority such that the rank of priority of a mobile battery 22 whose progress of deterioration is faster than the management target and at least either the lending history or the charge/discharge history matches a predetermined condition becomes higher than the ranks of priority of other mobile batteries 22. The lending condition deciding unit 652 may also decide the aggregate ranks of priority such that the rank of priority of a mobile battery 22 whose progress of deterioration is slower than the management target and at least either the lending history or the charge/discharge history matches a predetermined condition becomes lower than the ranks of priority of other mobile batteries 22.

For example, if the progress of deterioration of a particular mobile battery 22 is faster than the management target, the lending condition deciding unit 652 analyzes the lending history and charge/discharge history of the mobile battery and calculates the cumulative value of time during which it is stored in a battery station 210 with an SOC higher than a predetermined threshold. Generally, if the SOC remains high for a long time, deterioration of the battery is promoted. In view of this, if the above-mentioned cumulative value is larger than a predetermined threshold, the lending condition deciding unit 652 decides to make the aggregate rank of priority of the above-mentioned mobile battery 22 higher than other mobile batteries 22. Thereby, usage of the above-mentioned mobile battery 22 is promoted, and it is possible to prevent the SOC from remaining high for a long time. As a result, as the number of times of lending increases over time, the difference between the management target of the state of health of the above-mentioned mobile battery 22 and its current state of health gradually decreases.

According to another embodiment, the lending condition deciding unit 652 decides aggregate ranks of priority such that the rank of priority of a mobile battery 22 whose progress of deterioration is faster than the management target and at least either the lending history or the charge/discharge history matches a predetermined condition becomes lower than the ranks of priority of other mobile batteries 22. The lending condition deciding unit 652 may also decide the aggregate ranks of priority such that the rank of priority of a mobile battery 22 whose progress of deterioration is slower than the management target and at least either the lending history or the charge/discharge history matches a predetermined condition becomes higher than the ranks of priority of other mobile batteries 22.

For example, if the progress of deterioration of a particular mobile battery 22 is faster than the management target, the lending condition deciding unit 652 decides to make the aggregate rank of priority of the above-mentioned mobile battery 22 lower than other mobile batteries 22. Thereby, lending of the above-mentioned mobile battery 22 is inhibited for a while, and as the number of times of lending increases over time, the difference between the management target of the state of health the above-mentioned mobile battery 22 and its current state of health gradually decreases.

At this time, the lending condition deciding unit 652 may also analyze the lending history and charge/discharge history of the above-mentioned mobile battery 22 and calculate the cumulative value of time during which it is stored in a battery station 210 with an SOC higher than a predetermined threshold. Then, the aggregate ranks of priority may be decided such that a mobile battery 22 having a larger cumulative value mentioned above is ranked higher in the ranks of priority. Thereby, usage of the above-mentioned mobile battery 22 is promoted, and it is possible to prevent the SOC from remaining high for a long time. As a result, as the number of times of lending increases over time, the difference between the management target of the state of health of the above-mentioned mobile battery 22 and its current state of health gradually decreases.

In the present embodiment, the defective item detecting unit 654 detects a defective mobile battery 22. For at least one of one or more mobile batteries 22, the defective item detecting unit 654 for example judges whether or not the mobile battery is a defective item. The defective item detecting unit 654 for example detects a defective item by the following procedure. First, the defective item detecting unit 654 acquires a management condition about at least one of aggregate mobile batteries 22 from the management condition generating unit 630. The defective item detecting unit 654 acquires information about a current usage index of each of at least one mobile battery 22 from the communication unit 610. The defective item detecting unit 654 acquires information indicating the current state of health of each of at least one mobile battery 22 from the communication unit 610.

Next, for each of at least one mobile battery 22, the defective item detecting unit 654 judges whether or not the mobile battery is a defective item based on (i) a management condition indicating a correspondence between a usage index and a state of health, (ii) the current usage index and (iii) the current state of health. According to one embodiment, the defective item detecting unit 654 judges, as being a defective item, a mobile battery 22 whose current state of health deviates from a management target at a speed matching a predetermined condition. According to another embodiment, the defective item detecting unit 654 may judge the quality of a mobile battery based on the rate of change in the state of health. For example, the defective item detecting unit 654 judges, as a defective item, a mobile battery 22 whose current state of health rapidly changed from the second latest state of health.

Figure 7:
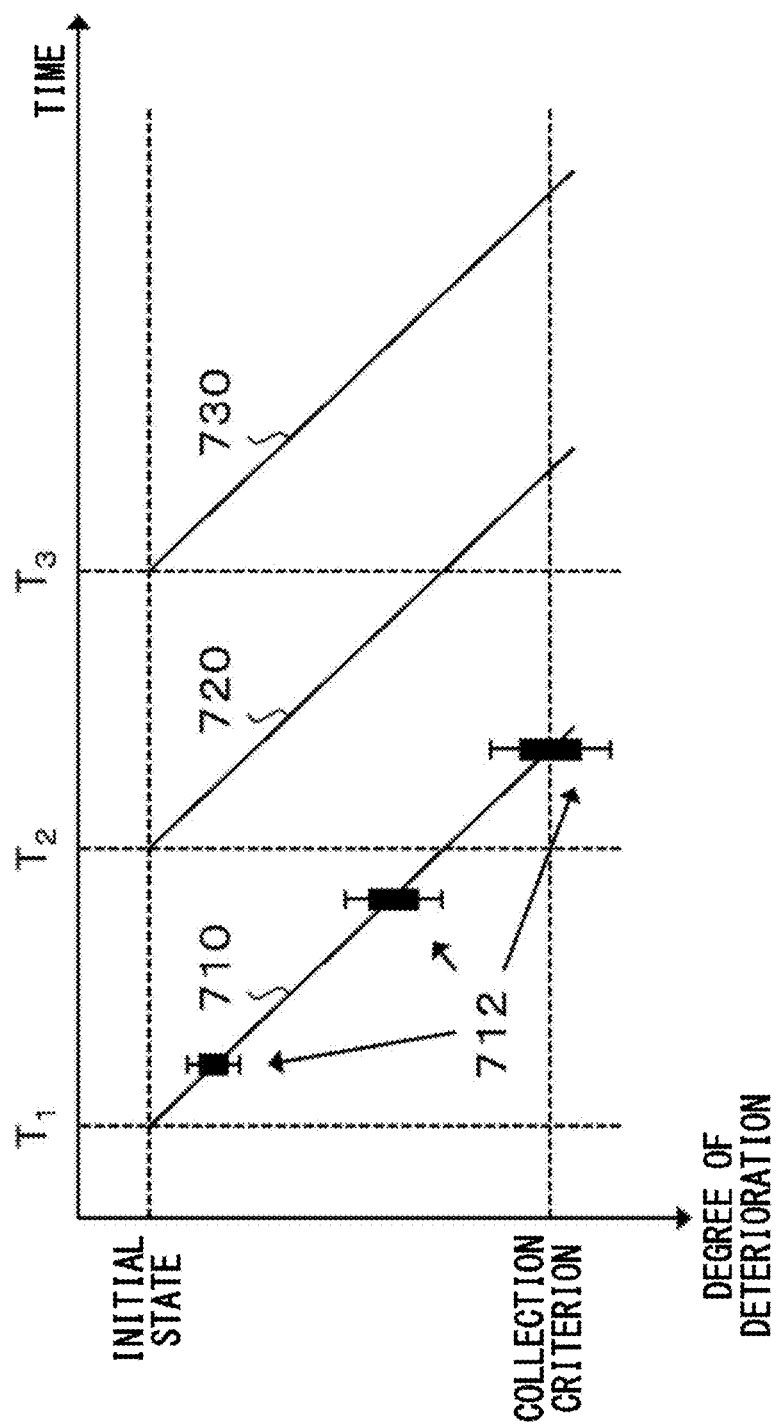
FIG. 7 schematically shows an exemplary management method performed by the battery managing system 200.
Figure 8:
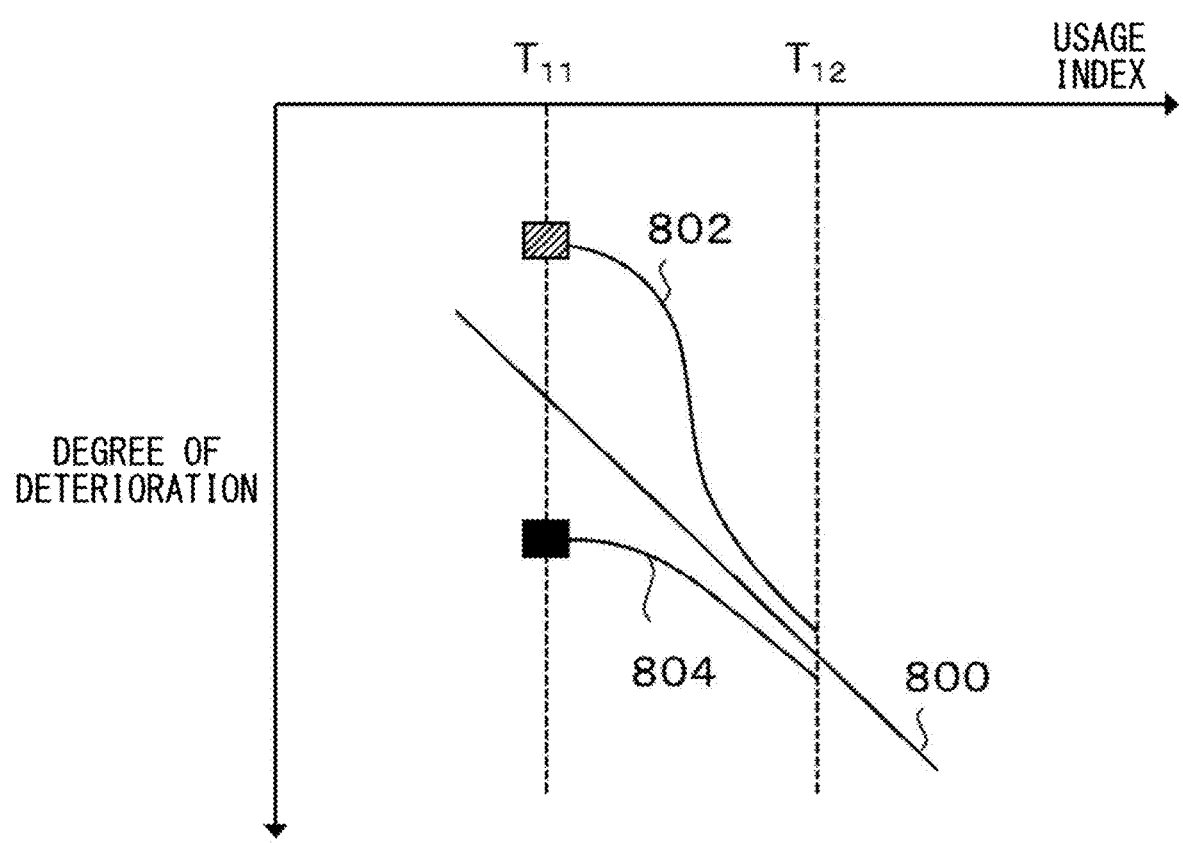
FIG. 8 schematically shows an exemplary management method performed by the battery managing system 200.
Figure 9:
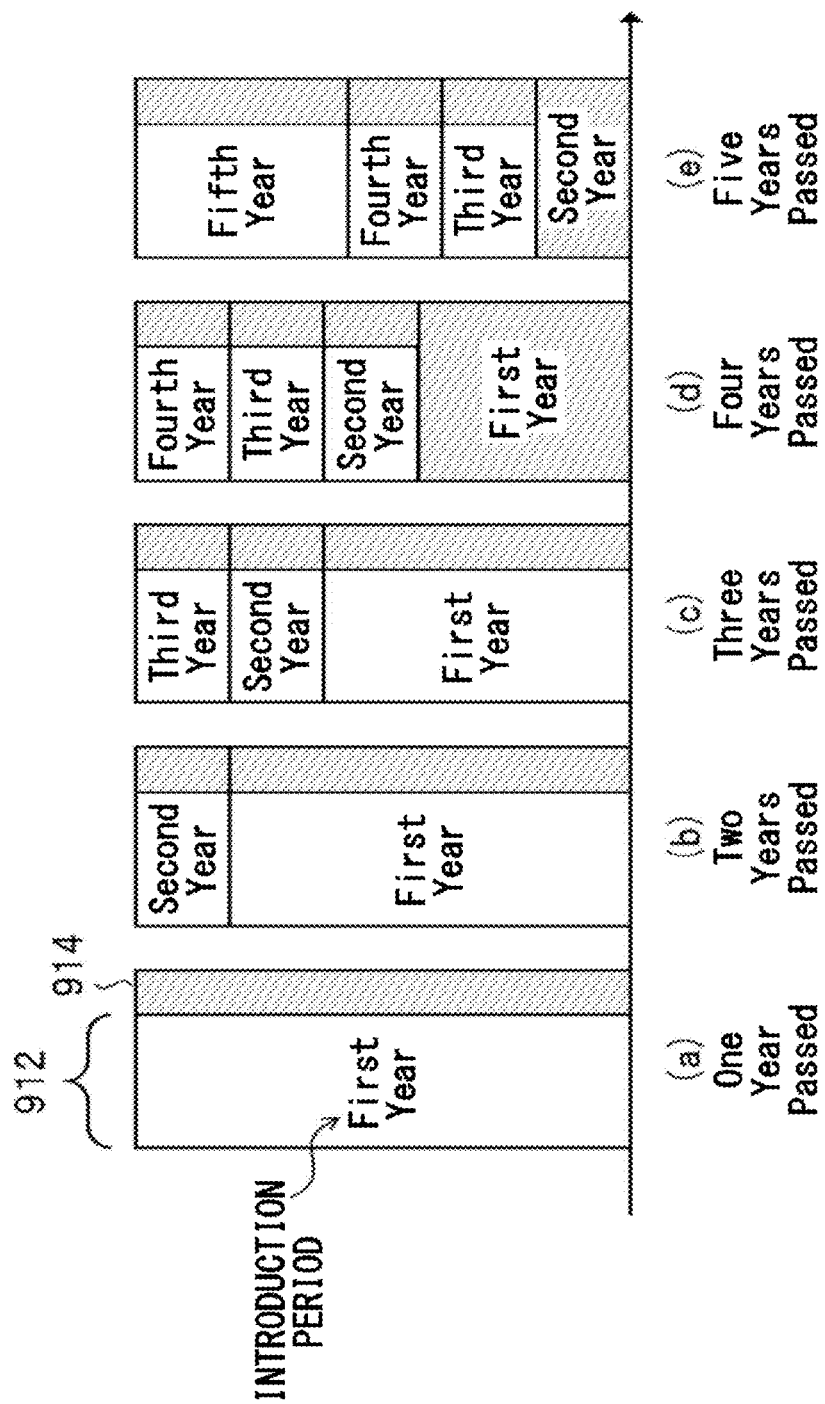
FIG. 9 schematically shows an exemplary management method performed by the battery managing system 200.

Using FIG. 7, FIG. 8 and FIG. 9, an exemplary management method performed by the battery managing system 200 is explained. FIG. 7 schematically shows an exemplary management condition. FIG. 7 shows a management condition 710 of mobile batteries 22 introduced into the market at a time T1, a management condition 720 of mobile batteries 22 introduced into the market at a time T2, and a management condition 730 of mobile batteries 22 introduced into the market at a time T3.

For example, the management condition 710 is calculated based on statistics of the states of health of aggregate mobile batteries 22. The statistics are the average, for example. Because of this, in the present embodiment, the states of health of individual mobile batteries 22 have a distribution 712 centered on the management condition 710. In addition, the distribution 712 widens over time. However, according to the battery managing system 200, for example, a widening of the distribution 712 over time can be suppressed.

FIG. 8 schematically shows an exemplary rank-of-priority deciding method performed by the lending condition deciding unit 652. FIG. 8 schematically shows an exemplary management condition 800 for a mobile battery 802 and a mobile battery 804, an exemplary deterioration curve of the mobile battery 802 and an exemplary deterioration curve of the mobile battery 804. According to the embodiment in FIG. 8, the progress of deterioration of the mobile battery 802 is slower in terms of a usage index T11, as compared with a management target. On the other hand, the progress of deterioration of the mobile battery 804 is faster as compared with the management target. In view of this, the lending condition deciding unit 652 decides the aggregate ranks of priority of the mobile battery 802 and mobile battery 804 such that the deterioration curve of the mobile battery 802 and the deterioration curve of the mobile battery 804 become close to the management condition 800 along with the progress of the usage index (as the elapsed time becomes longer, for example).

FIG. 9 schematically shows an exemplary work of collecting mobile batteries 22 in a case where a management method is implemented by the battery managing system 200. In FIG. 9, a block 912 indicates mobile batteries 22 that can be used also in the next fiscal year, and a block 914 indicates mobile batteries 22 that can be no longer used due to malfunctions, damages, deterioration or the like. In the example of FIG. 9, the battery managing system 200 adjusts the ranks of priority of to-be-managed mobile batteries 22 such that they are collected from the market upon the lapse of four years since they are introduced into the market.

As shown in FIG. 9, in the present embodiment, at the time point at which one year passes since mobile batteries 22 are introduced into the market, some mobile batteries 22 can no longer be used due to initial failure, malfunctions of electrical circuits, damages caused by lack of care of users, or the like. In view of this, at the time point at which one year passes, mobile batteries 22 are supplementarily provided. In FIG. 9, the supplementarily provided mobile batteries 22 are shown in a block "Second Year" which indicates the introduction period. Likewise, the second year and third year pass. Then, at a time point at which the fourth year passes, the mobile batteries 22 introduced in the first year are all collected from the market. According to the present embodiment, dispersion of the states of health to-be-managed mobile batteries 22 can be managed, so for example mobile batteries 22 introduced in the same period can be collected in the same period.

FIG. 10 schematically shows an exemplary data table 1000. The data table 1100 for example may be exemplary battery information stored in the battery information storing unit 542. The data table 1000 may be exemplary information indicating the lending history of one or more mobile batteries 22.

In the present embodiment, the data table 1000 for example stores battery IDs 1010 of mobile batteries 22, user IDs 1020 of users to use the mobile batteries 22, lending status 1030 of the mobile batteries 22, return status 1040 of the mobile batteries 22 and charge/discharge history 1050 of the mobile batteries 22 after being returned, in association with each other. The lending status 1030 for example includes information about lending dates/times 1032, SOCs 1034 at the time of lending, station IDs 1036 of battery stations 210 to be locations at which they are lent. The return status 1040 includes information about return dates/times 1042, SOCs 1044 at the time of returning, station IDs 1046 of battery stations 210 to be locations at which they are returned.

FIG. 11 schematically shows an exemplary data table 1100. The data table 1100 for example may be exemplary battery information stored in the battery information storing unit 542. The data table 1100 may be exemplary information indicating the charge/discharge history of one or more mobile batteries 22. In the present embodiment, the data table 1100 for example stores battery IDs 1110, states of health 1120, charge speeds 1130, current SOCs 1140, lending status 1150, operational status 1160 and storage locations 1170, in association with each other.

While the embodiments of the present invention have been described, the technical scope of the invention is not limited to the above described embodiments. It is apparent to persons skilled in the art that various alterations and improvements can be added to the above-described embodiments. In addition, matters explained with reference to a particular embodiment can be applied to other embodiments as long as such application does not cause a technical contradiction. It is also apparent from the scope of the claims that the embodiments added with such alterations or improvements can be included in the technical scope of the invention.

The operations, procedures, steps, and steps of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

Explanation of Reference Symbols

10: communication network; 22: mobile battery; 34: power generating apparatus; 36: power system; 38: electrical device; 100: managing apparatus; 110: target information acquiring unit; 120: usage information acquiring unit; 130: wear information acquiring unit; 140: deciding unit; 200: battery managing system; 210: battery station; 220: managing server; 230: user terminal; 312: watthour meter; 314: distribution board; 320: control circuit; 330: battery storing unit; 332: connector; 340: sense unit; 350: control unit; 352: communication control unit; 354: charge/discharge control unit; 356: lending managing unit; 410: state monitoring unit; 420: lending history managing unit; 430: charge/discharge history managing unit; 440: management target acquiring unit; 450: rank-of-priority deciding unit; 460: to-be-lent object deciding unit; 510: state monitoring unit; 520: battery managing unit; 530: reservation managing unit; 540: storing unit; 542: battery information storing unit; 544: station information storing unit; 610: communication unit; 620: management group setting unit; 630: management condition generating unit; 640: regional characteristics managing unit; 650: judging unit; 652: lending condition deciding unit; 654: defective item detecting unit; 710: management condition; 712: distribute; 720: management condition; 730: management condition; 800: management condition; 802: mobile battery; 804: mobile battery; 912: block; 914: block; 1000: data table; 1010: battery ID; 1020: user ID; 1030: lending status; 1032: lending date/time; 1034: SOC; 1036: station ID; 1040: return status; 1042: return date/time; 1044: SOC; 1046: station ID; 1050: charge/discharge history; 1100: data table; 1110: battery ID; 1120: state of health; 1130: charge speed; 1140: SOC; 1150: lending status; 1160: operational status; 1170: storage location

What is claimed is:

1. A managing apparatus that manages usage of a plurality of expendables, the managing apparatus comprising:
   a target information acquiring unit that acquires target information indicating a target condition about a degree of wear of the plurality of expendables;
   a usage information acquiring unit that acquires usage information indicating a degree of usage of each of the plurality of expendables from a start of usage of the expendable;
   a wear information acquiring unit that acquires wear information indicating a degree of wear of each of the plurality of expendables; and
   a deciding unit that decides, for each of the plurality of expendables, at least either (i) whether or not usage of each expendable is possible or (ii) a degree of priority about usage of each expendable based on (i) a target condition indicated by the target information acquired by the target information acquiring unit, (ii) a degree of usage of each expendable indicated by the usage information acquired by the usage information acquiring unit and (iii) a degree of wear of each expendable indicated by the wear information acquired by the wear information acquiring unit, wherein
   the target condition includes a condition about the degree of usage.

2. The managing apparatus according to claim 1, wherein
   the target condition represents a correspondence between a degree of usage of a particular expendable and a value or range to be a target of a degree of wear of the particular expendable, and
   for each of the plurality of expendables, the deciding unit:
      decides the target of a degree of wear of each expendable based on a degree of usage of each expendable indicated by the usage information and a target condition indicated by the target information; and
      decides at least either (i) whether or not usage of each expendable is possible or (ii) a degree of priority about usage of each expendable such that a difference between the decided target and a degree of wear of each expendable indicated by the wear information decreases.

3. The managing apparatus according to claim 2, wherein the degree of usage is:
   at least one of:
      (i) the number of times of replenishment or regeneration of a particular expendable from the start of usage of the expendable;
      (ii) usage time of a particular expendable by a user from the start of usage of the expendable; or
      (iii) elapsed time from a time point of the start of usage of a particular expendable; or
   an index determined based on at least one of the number of times, the usage time or the elapsed time.

4. The managing apparatus according to claim 2, further comprising a history information acquiring unit that acquires history information indicating a usage history of each of the plurality of expendables from the start of usage of the expendable, wherein
   for each of the plurality of expendables, the deciding unit decides at least either (i) whether or not usage of each expendable is possible or (ii) a degree of priority about usage of each expendable based on (i) a difference between the decided target and a degree of wear of each expendable indicated by the wear information and (ii) a usage history of each expendable indicated by the history information acquired by the history information acquiring unit.

5. The managing apparatus according to claim 4, wherein each of the plurality of expendables is a storage battery, and
   the history information is information indicating a state-of-charge history.

6. The managing apparatus according to claim 5, wherein the deciding unit decides at least either (i) whether or not usage of each expendable is possible or (ii) a degree of priority about usage of each expendable such that a degree of priority of an expendable having (i) a degree of wear indicated by the wear information indicating that a progress of deterioration is fast as compared with the decided target and (ii) the state-of-charge history matching a predetermined condition becomes higher than a degree of priority of another expendable.

7. The managing apparatus according to claim 5, wherein the deciding unit decides at least either (i) whether or not usage of each expendable is possible or (ii) a degree of priority about usage of each expendable such that a degree of priority of an expendable having (i) a degree of wear indicated by the wear information indicating that a progress of deterioration is slow as compared with the decided target and (ii) the state-of-charge history matching a predetermined condition becomes lower than a degree of priority of another expendable.

8. The managing apparatus according to claim 5, wherein the deciding unit decides at least either (i) whether or not usage of each expendable is possible or (ii) a degree of priority about usage of each expendable such that a degree of priority of an expendable having (i) a degree of wear indicated by the wear information indicating that a progress of deterioration is fast as compared with the decided target and (ii) the state-of-charge history matching a predetermined condition becomes lower than a degree of priority of another expendable.

9. The managing apparatus according to claim 5, wherein the deciding unit decides at least either (i) whether or not usage of each expendable is possible or (ii) a degree of priority about usage of each expendable such that a degree of priority of an expendable having (i) a degree of wear indicated by the wear information indicating that a progress of deterioration is slow as compared with the decided target and (ii) the state-of-charge history matching a predetermined condition becomes higher than a degree of priority of another expendable.

10. The managing apparatus according to any one of claims 1, wherein
for each of the plurality of expendables, the deciding unit:
judges whether or not each expendable is a defective item based on (i) a target condition indicated by the target information acquired by the target information acquiring unit, (ii) a degree of usage of each expendable indicated by the usage information acquired by the usage information acquiring unit, and (iii) a degree of wear of each expendable indicated by the wear information acquired by the wear information acquiring unit, and
decides an expendable judged as a defective item as being unavailable.

11. The managing apparatus according to any one of claims 1, wherein
for each of the plurality of expendables, the deciding unit:
decides a degree of priority about usage of each expendable based on (i) a target condition indicated by the target information acquired by the target information acquiring unit, (ii) a degree of usage of each expendable indicated by the usage information acquired by the usage information acquiring unit, and (iii) a degree of wear of each expendable indicated by the wear information acquired by the wear information acquiring unit, and
decides an expendable having the degree of priority matching a predetermined condition as being unavailable.

12. The managing apparatus according to any one of claims 1, wherein the target information acquiring unit acquires target information indicating a target condition matching a degree of usage of each expendable indicated by the usage information among a plurality of target conditions about a degree of usage.

13. The managing apparatus according to any one of claims 1, further comprising a target condition generating unit that generates a target condition of each group based on a statistic of a degree of wear of each expendable constituting each group, for each of one or more groups obtained by classifying each of the plurality of expendables according to a degree of usage of each expendable.

14. The managing apparatus according to any one of claims 1, further comprising an extracting unit that extracts one or more expendables having higher priority for usage among the plurality of expendables based on at least either (i) whether or not usage of the plurality of expendables is possible or (ii) a degree of priority of the plurality of expendables that is decided by the deciding unit.

15. A non-transitory computer-readable storage medium having stored thereon a program for making a computer execute a management method of managing usage of a plurality of expendables, the management method comprising:
acquiring target information indicating a target condition about a degree of wear of the plurality of expendables;
acquiring usage information indicating a degree of usage of each of the plurality of expendables from a start of usage of the expendable;
acquiring wear information indicating a degree of wear of each of the plurality of expendables; and
deciding, for each of the plurality of expendables, at least either (i) whether or not usage of each expendable is possible or (ii) a degree of priority about usage of each expendable based on (i) a target condition indicated by the target information acquired at the acquisition of target information, (ii) a degree of usage of each expendable indicated by the usage information acquired at the acquisition of usage information and (iii) a degree of wear of each expendable indicated by the wear information acquired at the acquisition of wear information, wherein
the target condition includes a condition about the degree of usage..

16. A management method for managing usage of a plurality of expendables by using a computer, the management method comprising:
acquiring, by the computer, target information indicating a target condition about a degree of wear of an expendable among the plurality of expendables;
acquiring, by the computer, usage information indicating a degree of usage of each of the plurality of expendables from a start of usage of the expendable;
acquiring, by the computer, wear information indicating a degree of wear of each of the plurality of expendables; and
deciding, for each of the plurality of expendables and by the computer, at least either (i) whether or not usage of each expendable is possible or (ii) a degree of priority about usage of each expendable based on (i) a target condition indicated by the target information acquired at the acquisition of target information, (ii) a degree of usage of each expendable indicated by the usage information acquired at the acquisition of usage information and (iii) a degree of wear of each expendable indicated by the wear information acquired at the acquisition of wear information, wherein
the target condition includes a condition about the degree of usage.

* * * * *